(12) United States Patent
Cha et al.

(10) Patent No.: US 6,399,420 B2
(45) Date of Patent: Jun. 4, 2002

(54) ULTRA HIGH DENSITY INTEGRATED CIRCUIT BLP STACK AND METHOD FOR FABRICATING THE SAME

(75) Inventors: Gi Bon Cha; Hee Joong Suh, both of Chungcheongbuk-do; Chang Kuk Choi, Seoul, all of (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/848,586

(22) Filed: May 4, 2001

Related U.S. Application Data

(62) Division of application No. 09/166,520, filed on Oct. 6, 1998.

(30) Foreign Application Priority Data

May 6, 1998 (KR) .............................. 98-16194
May 7, 1998 (KR) .............................. 98-16342

(51) Int. Cl.⁷ ............................................ H01L 21/44
(52) U.S. Cl. ........................ 438/109; 257/686; 257/696
(58) Field of Search .......................... 438/109; 257/686, 257/696

(56) References Cited

U.S. PATENT DOCUMENTS

| | | | | |
|---|---|---|---|---|
| 5,446,620 A | | 8/1995 | Burns et al. ................. | 361/704 |
| 5,760,471 A | | 6/1998 | Fujisawa et al. ............. | 257/692 |
| 5,804,874 A | | 9/1998 | An et al. ..................... | 257/676 |
| 6,002,167 A | * | 12/1999 | Hatano et al. ............... | 257/696 |
| 6,064,112 A | * | 5/2000 | Iwaya et al. ................. | 257/673 |
| 6,265,660 B1 | * | 7/2001 | Tandy ........................ | 174/52.4 |

* cited by examiner

*Primary Examiner*—David Nelms
*Assistant Examiner*—Tu-Tu Ho
(74) *Attorney, Agent, or Firm*—Morgan, Lewis & Bockius LLP

(57) ABSTRACT

BLP stack is disclosed which has a higher reliability and a less area of mounting for providing a denser package, including a first package having external power connection leads each started to be exposed through a bottom thereof and extended to a top surface through a side surface inclusive of bottom lead portions on a bottom surface, side lead portions on a side surface, and upper lead portions on a top surface, and a second package having external power connection leads started to be exposed through a bottom thereof and brought into contact with the external power connection leads on the first package to be electrically connected thereto.

3 Claims, 27 Drawing Sheets

Top TSOP

Bottom TSOP

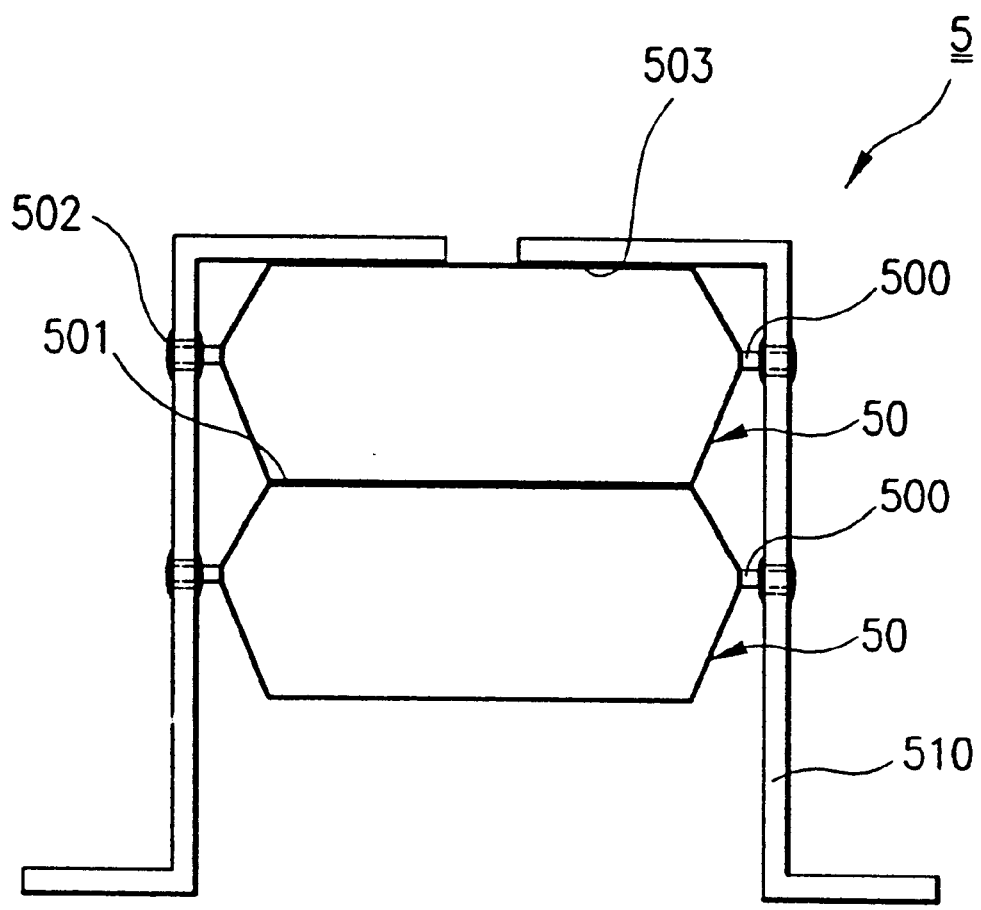

VACUUM

VACUUM

ULTRA HIGH DENSITY INTEGRATED CIRCUIT BLP STACK AND METHOD FOR FABRICATING THE SAME

This is a divisional of copending application application Ser. No. 09/166,520 filed on Oct. 6, 1998.

BACKGROUND OF THE INVENTION

1. Field of the Invention

The present invention relates to a BLP stack of ultra-high density integrated circuits and a method for fabricating the same, and more particularly, to a BLP stack of ultra-high density integrated circuits and a method for fabricating the same which is made lighter, thinner, shorter, and smaller with a higher reliability and a less area of mounting for providing a denser package.

2. Discussion of the Related Art

In general, packaging techniques for integrated circuits have been developed in the past in an attempt to satisfy demands for miniaturization in the semiconductor industry. Improved methods for miniaturization of integrated circuits enabling the integration of millions of circuit elements into single integrated silicon embodied circuits, or chips, have resulted in increased emphasis on methods to package theses circuits in space efficient, yet reliable and mass producible packages.

FIGS. 1a~3c illustrates the steps of fabricating processes for obtaining stacks of semiconductor packages of which memory sizes are extended by stacking completed packages into a memory size extended semiconductor package stack. The steps of process for fabricating a background art TSOP (Thin Small Outline Package) stack 5 will be explained.

Referring to FIGS. 1a and 1b, a top, and a bottom TSOPs 50 are provided. As shown in FIG. 2b, both bent outer leads 500 on each of the TSOPs 50 are straightened as shown in FIG. 2b, and cut far ends only leaving short lengths as shown in FIG. 2c. Then, the TSOPs 50 are stacked and bonded together with the leads aligned as shown in FIG. 3a. There is adhesive 501 applied between the top, and bottom TSOPs 50. As shown in FIG. 3b, stacking rails 510 having holes 511 for inserting and connecting the outer leads 500 of the TSOPs 50 thereto are provided, the holes 510 in the stacking rails 510 and fore ends of the outer leads 500 on the bonded TSOPs 50 are aligned, and the outer leads 500 on the TSOPs 50 are inserted into the holes 511 in the rails 510. Then, adhesive 503 is applied to an underside of a top parts of the rails 510 and the rails 510 and a top surface of the TSOP 50 are attached, preventing movement of the rails 510. Solder paste 502 is applied to upper sides of the holes 511 in the rails 510 and heated so that the solder paste 502 bonds the rails 510 and the outer leads 500 together. Instead of using the solder paste in the bonding, the bonding parts may be dipped into molten solder.

Thus, by the mechanical and electrical connection of the two packages, a TSOP stack 5 is completed, with a doubled memory capacity, i.e., a memory capacity of the package stack may be varied by stacking the TSOPs 50 as many as desired according to a memory capacity required. For example, if an 8-mega DRAM package stack is desired from 4-mega DRAM TSOPs, two of the 4-mega DRAM TSOPs are stacked, and if a 16-mega DRAM package stack is desired from 4-mega DRAM TSOPs, four of the 4-mega DRAM TSOPs are stacked.

FIG. 5 illustrates another example of background art stacked package for providing a package stack 6 thin, yet durable, resistant against mechanical distortion from moist and warping, and heat dissipative, disclosed in U.S. Pat. No. 5,446,620 in detail.

However, the background art simple package stack of chip packages results in the stack bulky and heavy. Also, the background art package stack has problems in that connections with the rails 510 are exposed and not satisfactory in strength, that degrades a reliability. And, the long signal lines from bonding pads on the semiconductor chip 7 to a printed circuit board(the outer leads and the rails) can cause a signal delay which hamper a fast performance, or a greater interference noise, degrading a reliability in terms of electrical performance. On the other hand, in the fabrication process, the repetitive adhesive bonding steps may cause distortion of components or weaken a bonding force between the semiconductor chip and the mold body. And, the increased number of fabrication steps due to the additional stacking of the completed packages, and the requirement for separate stacking equipments other than the equipments required for fabrication of the completed package requires additional cost and longer fabrication time period. Particularly, in the case of TSOP stack 5, the steps of process for stacking the packages are very complicated with straightening and cutting unnecessary portions of outer leads of completed TSOPs 50, separate fabrication of the rails 510, and alignment of leads 500 between the top and bottom TSOPs 50 for inserting the leads 500 into the holes 511 in the fabricated rails 510 as well as attachment of the rails on a top surface of the package.

SUMMARY OF THE INVENTION

Accordingly, the present invention is directed an ultra-high density integrated circuit BLP stack and a method for fabricating the same that substantially obviates one or more of the problems due to limitations and disadvantages of the related art.

An object of the present invention is to provide a semiconductor package stack which has a high density and short signal lines, with excellent mechanical and electrical reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the BLP stack of ultra-high density integrated circuit includes a three dimensional BLP having external power connection leads each started to be exposed through a bottom thereof and extended to surround a bottom surface, a side surface, and a top surface of a body of the package, and a standard BLP having bottom leads brought into contact with the bottom leads of the BLP, thereby being stacked on the three dimensional BLP.

In a second aspect of the present invention, there is provided a BLP stack of ultra-high density integrated circuit, including at least two three dimensional BLPs stacked in succession such that lead portions of an overlying three dimensional BLP and leads on an underlying three dimensional BLP are connected electrically to each other, the three dimensional BLPs having external power connection leads each started to be exposed through a bottom thereof and extended to bend around to surround a bottom surface, a side surface, and a top surface of a body of the package.

In a third aspect of the present invention, there is provided a BLP stack including a first BLP stack and a second BLP stack identical to the first BLP stack disposed opposite to the first BLP such that the bottom leads portions of the 3D BLP in the second BLP stack are brought into contact with the bottom lead portions of the 3D BLP in the first BLP stack, the first BLP stack having a 3D BLP with external power connection leads each started to be exposed through a bottom thereof and extended to bend around to surround a bottom surface, a side surface, and a portion of a top surface thereof and a standard type BLP stacked on the 3D BLP such that bottom leads of the standard BLP is electrically connected to upper lead portions exposed in an upper surface of a body of the 3D BLP.

In a fourth aspect of the present invention, there is provided a BLP stack including a 3D BLP having external power connection leads each started to be exposed through a bottom thereof and extended to bend around to surround a bottom surface, a side surface, and a portion of a top surface thereof, a standard type BLP placed on the bottom lead portions on the 3D BLP such that the bottom leads are electrically brought into contact with upper lead portions of the 3D BLP exposed in a top surface of the body thereof, and spacers fitted between the 3D BLP and the standard BLP for making the 3D BLP and the standard BLP spaced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 1a~3c illustrates cross sections each showing the step of a background art process for fabricating a semiconductor package stack, wherein, FIGS. 1a~1b illustrate cross sections of completed TSOPs provided for stacking, FIGS. 3a~3c illustrate cross sections showing the steps of a process of inserting a TSOP stack into stacking rails and soldering together;

FIGS. 23a~23h illustrate front views showing the steps of a fabrication process of the fourth embodiment BLP stack of ultra-high density integrated circuit of the present invention; wherein, FIG. 23a illustrates a front view showing a spacer dotted on the three dimensional BLP, FIG. 23b illustrates a front view showing a standard BLP mounted on the three dimensional BLP, FIG. 23c illustrates a front view showing the three dimensional BLP and the standard BLP mounted thereon clamped together with a holding jig, FIG. 23d illustrates a front view showing a BLP ready for soldering at one side thereof, FIG. 23e illustrates a front view showing a BLP under solder dipping at one side leads thereof, FIG. 23f illustrates a front view showing a BLP clamped by the holding jig rotating and vibrating for solder dipping the other side leads thereof, FIG. 23g illustrates a front view showing a BLP under solder dipping of the other side leads thereof, FIG. 23h illustrates a cross section showing a completed fourth embodiment BLP stack of ultra-high density integrated circuits of the present invention; and, FIG. 24 illustrates a front view of a fourth embodiment BLP stack of the present invention mounted on a mother board.

DETAILED DESCRIPTION OF THE PREFERRED EMBODIMENT

Figure 1A:
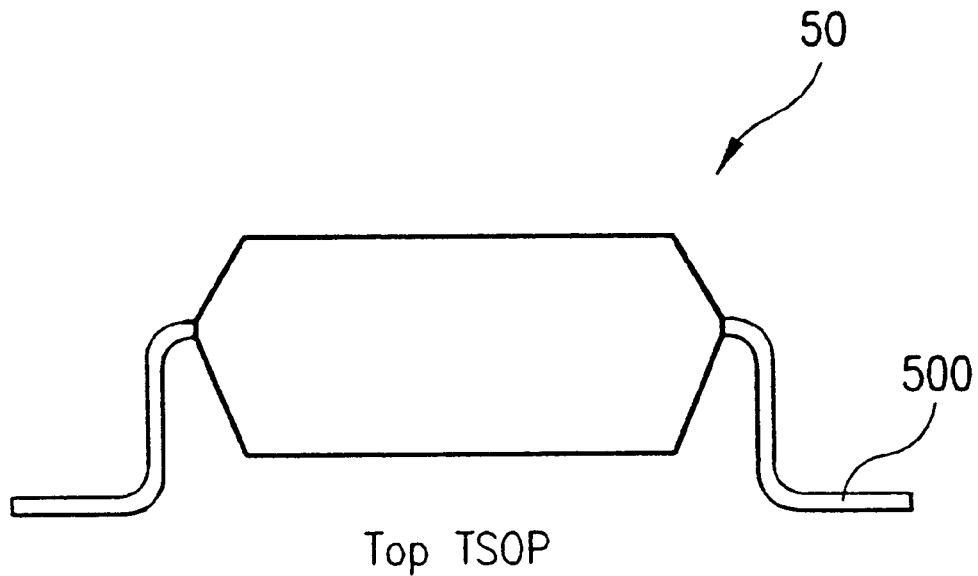
Figure 1B:
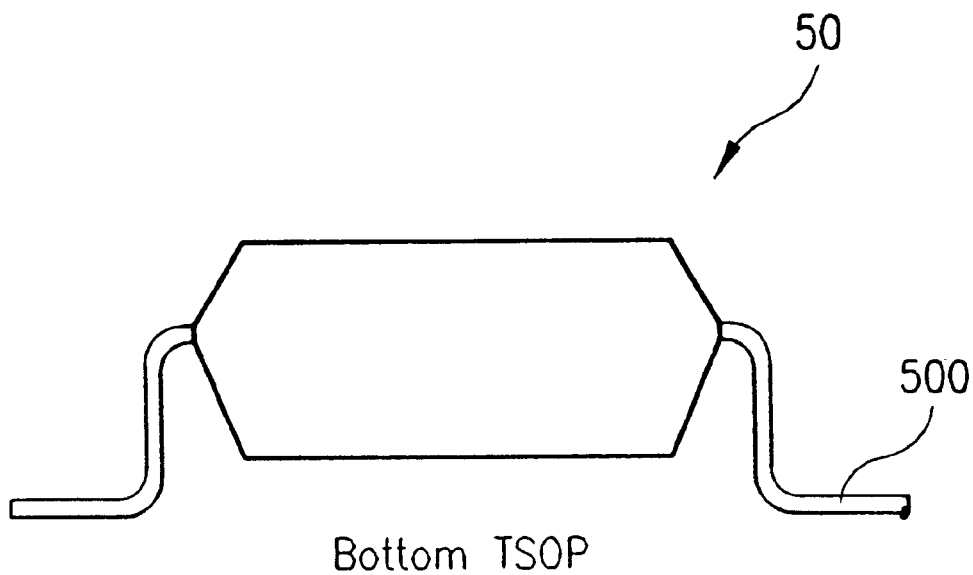
Figure 2A:
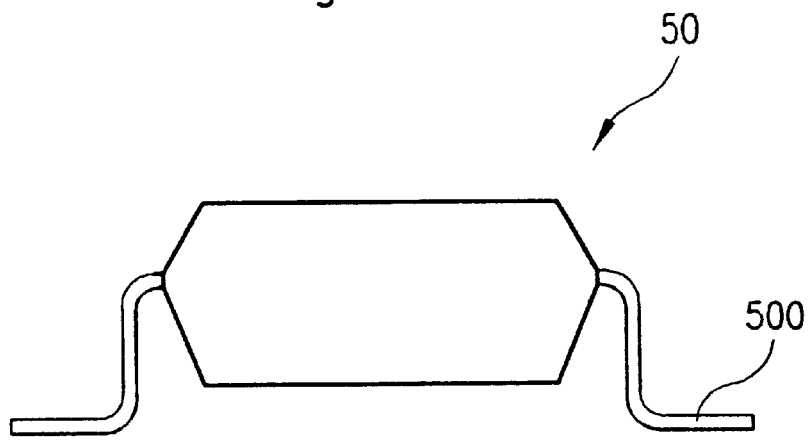
FIGS. 2a~2c illustrate cross sections showing the steps of a cutting process of outer leads on the TSOP.
Figure 2B:
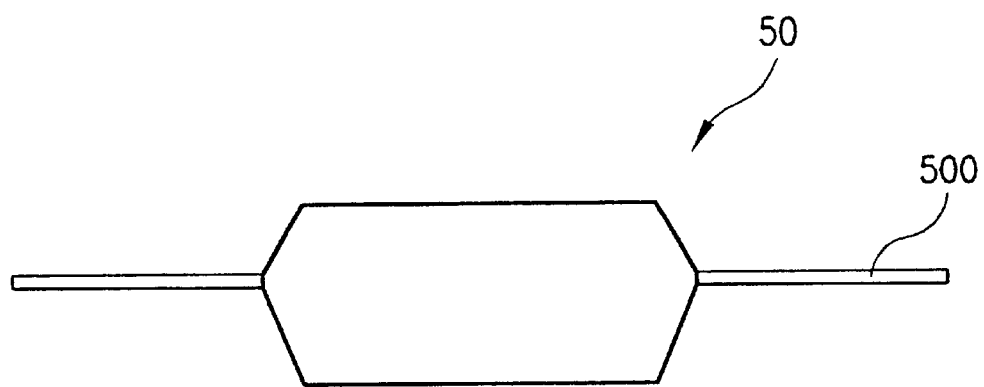
Figure 2C:
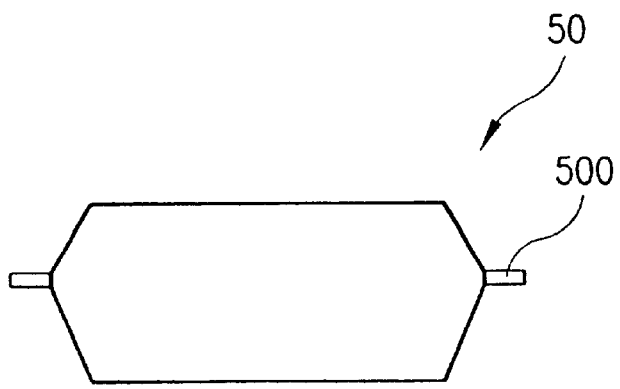
Figure 3A:
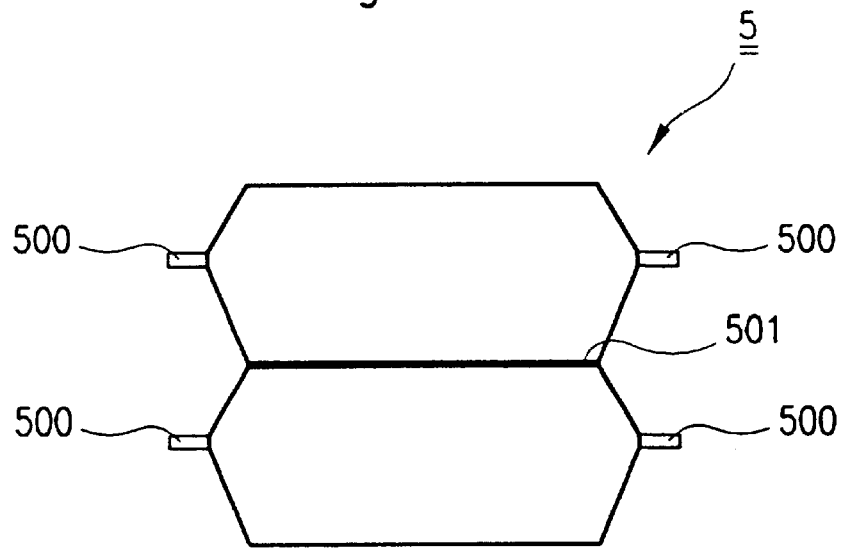
Figure 3B:
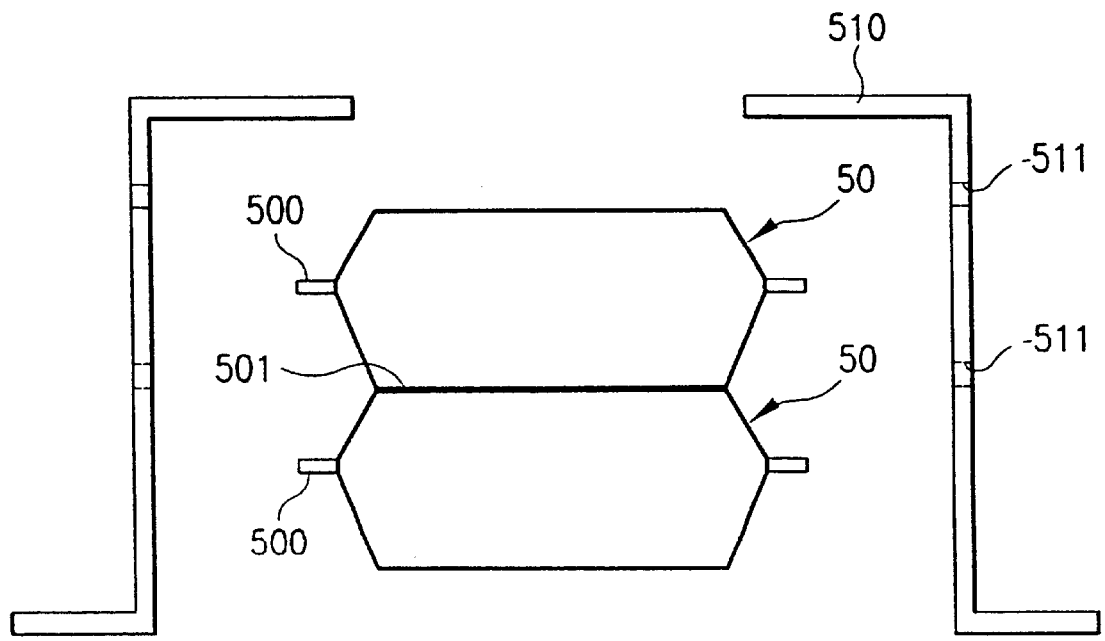
Figure 4A:
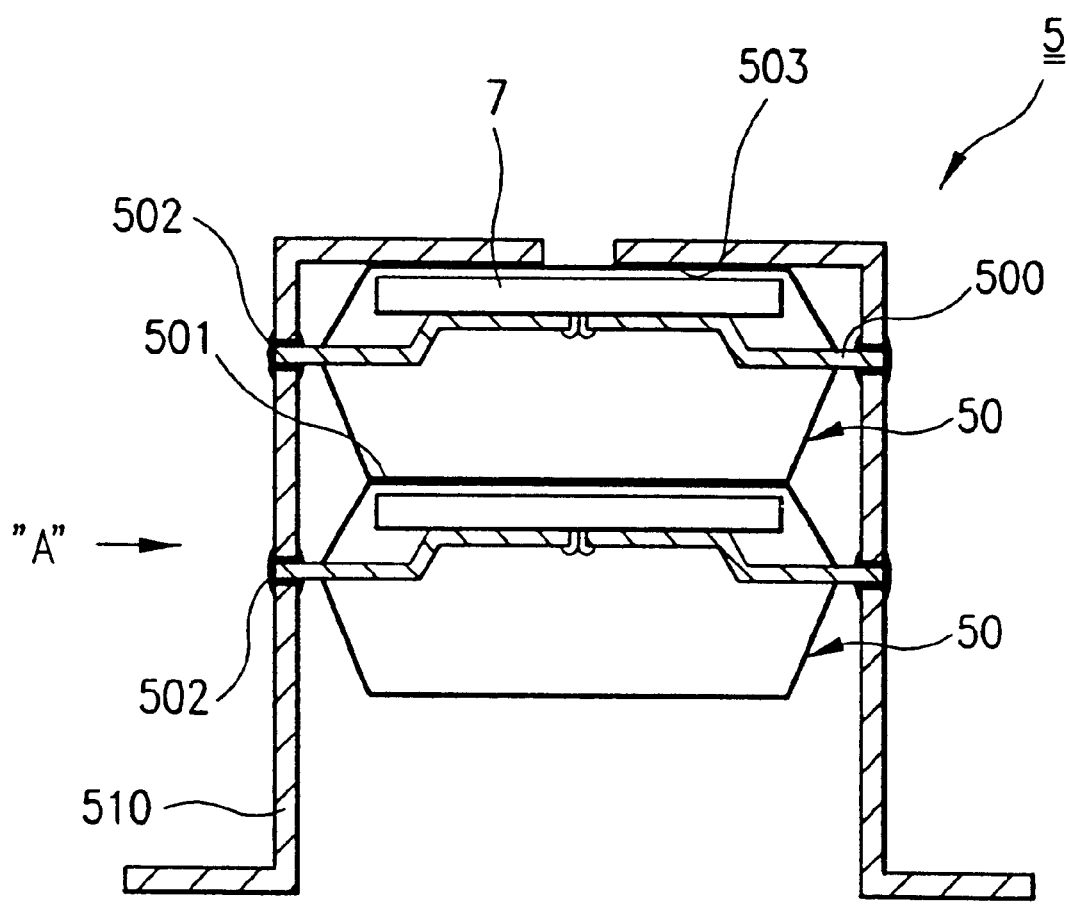
FIG. 4a illustrates a cross section showing a background art semiconductor package stack.
Figure 4B:
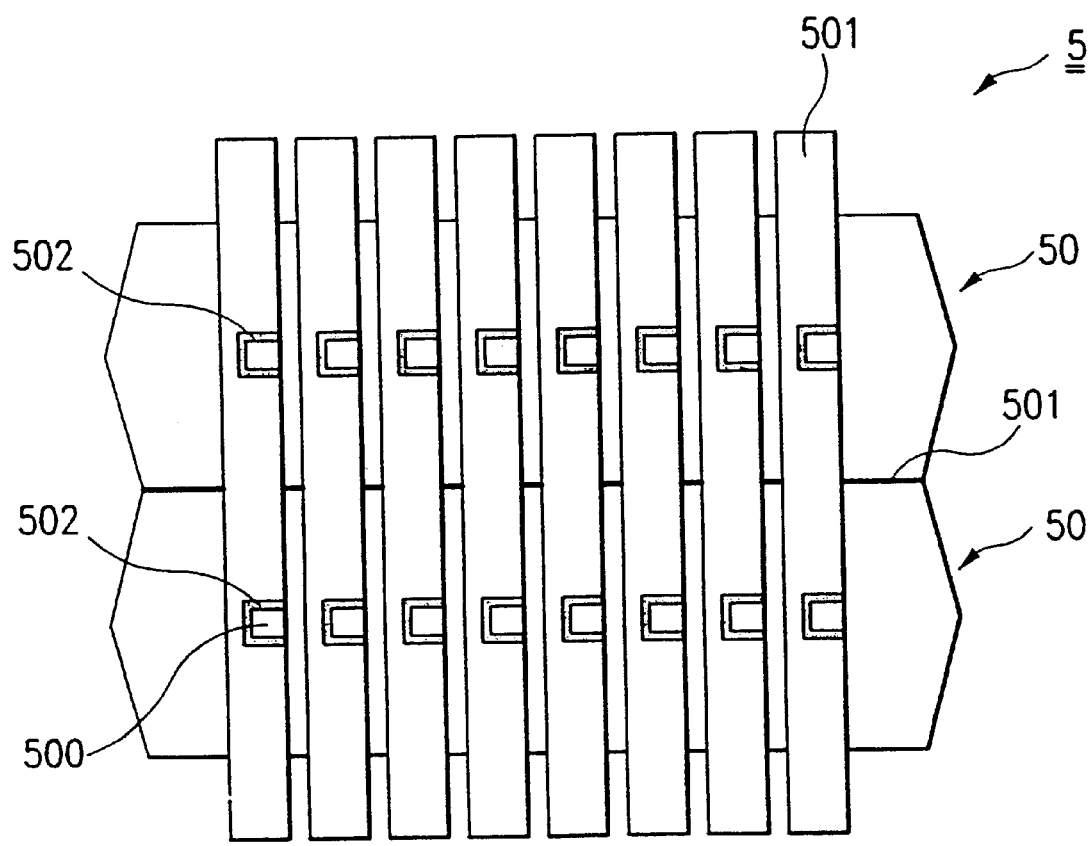
FIG. 4b illustrates a side view of the background art semiconductor package stack in FIG. 4a seen from "A" direction.
Figure 5:
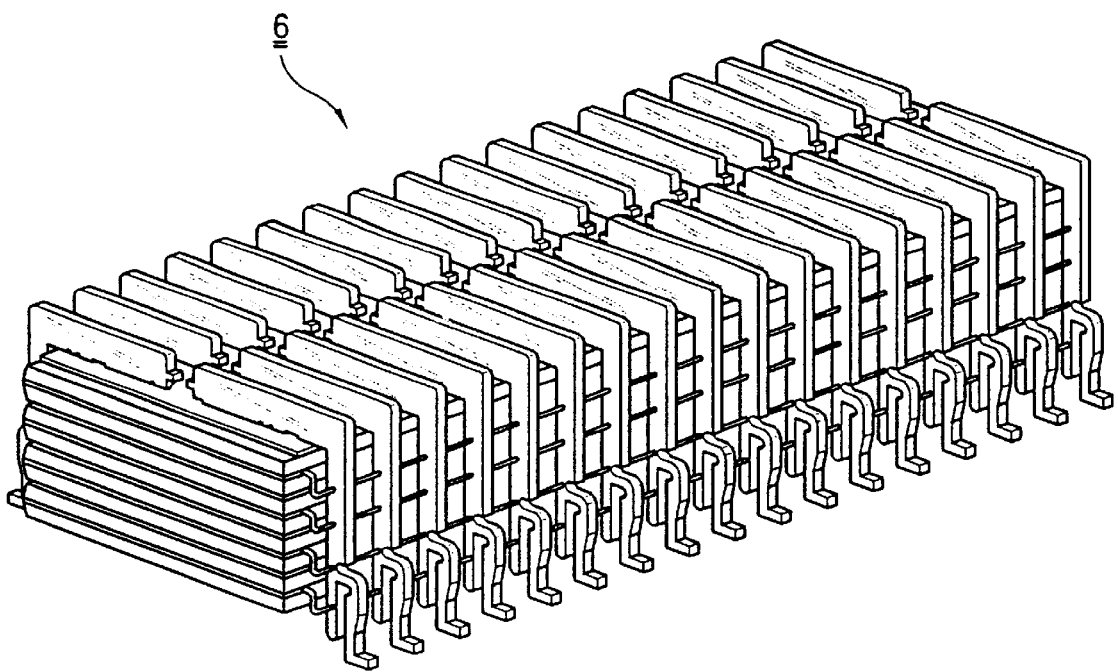
FIG. 5 illustrates a side view showing another example of a background art semiconductor package stack.
Figure 6A:
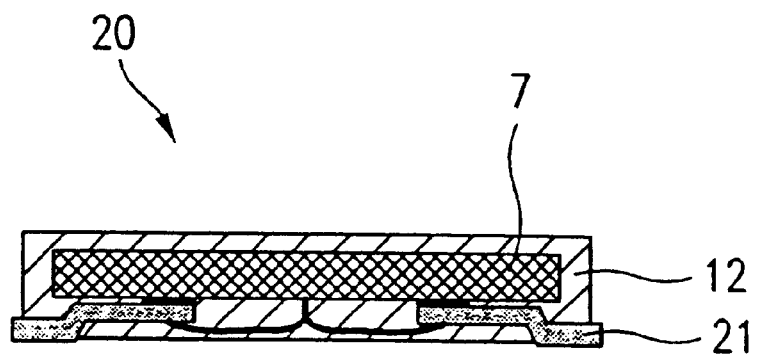
FIG. 6a illustrates a cross section of a standard BLP applied to the present invention.
Figure 6B:
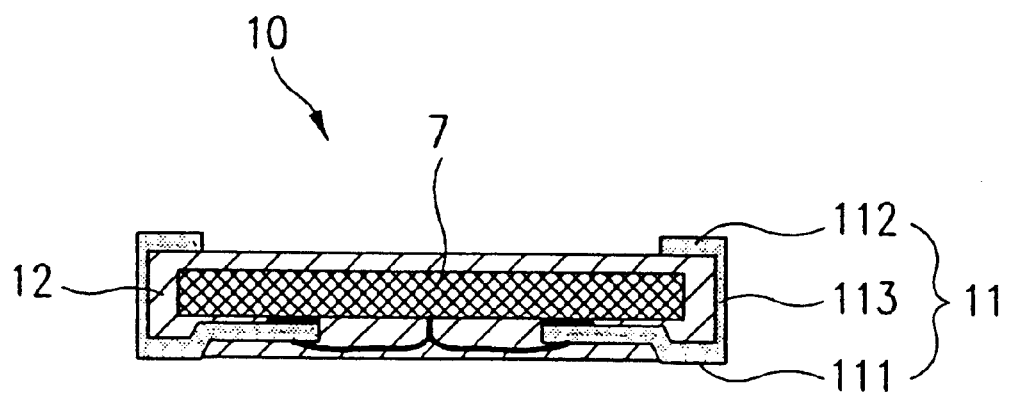
FIG. 6b illustrates a cross section of a three dimensional BLP applied to the present invention.

Reference will now be made in detail to the preferred embodiments of the present invention, examples of which are illustrated in the accompanying drawings. The steps of stacking process of a BLP stack in accordance with a preferred embodiment of the present invention will be explained with reference to FIGS. 6a~11. FIG. 6a and 6b illustrate cross sections of a standard BLP(Bottom Leaded Package) and a three dimensional BLP(3D BLP) applied to the present invention respectively, and FIG. 9 illustrates a cross section showing a BLP stack of ultra-high density integrated circuits in accordance with a first preferred embodiment of the present invention(stacking of a standard type and a three dimensional BLPs).

Figure 9:
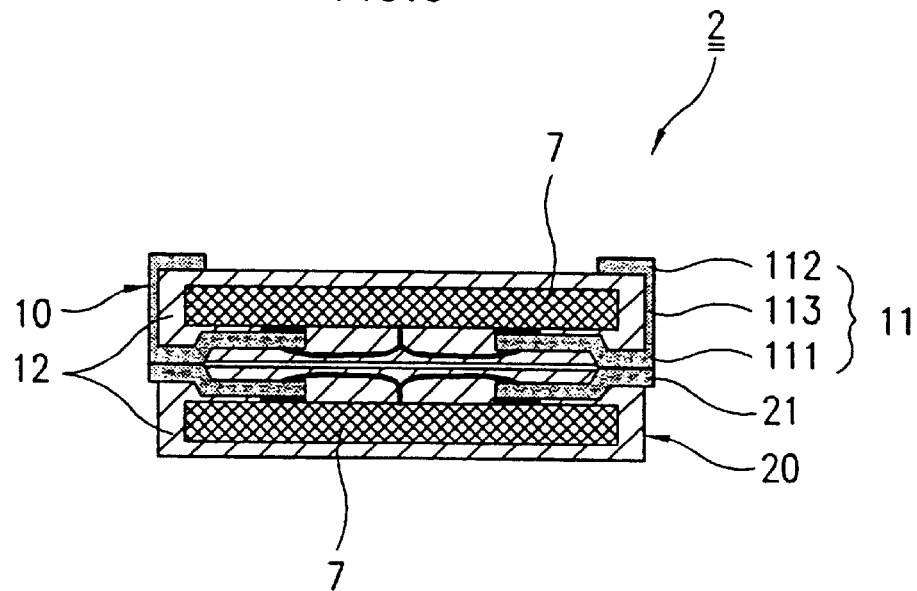
FIG. 9 illustrates a cross section showing a BLP stack of ultra-high density integrated circuits in accordance with a first preferred embodiment of the present invention(stacking of a standard type and a three dimensional BLPs)

Referring to FIGS. 6a, 6b, and 9, a BLP stack of ultra-high density integrated circuits in accordance with a first preferred embodiment of the present invention includes a three IDs dimensional BLP 10 having external power connection leads 11 each started to be exposed through a bottom thereof and extended to bend around to surround a bottom surface, a side surface, and a portion of a top surface thereof, and a standard type BLP 20 stacked on the 3D BLP 10 such that bottom leads 21 of the standard BLP 20 is electrically connected to bottom lead portions 111 exposed in the bottom surface of the 3D BLP 10. Each of the external power connection leads 11 on the 3D BLP 10 includes a bottom lead portion 111 on a bottom surface of a package body 12, a side lead portion 113 on a side of the body extended from the bottom lead portion 111, and an upper lead portion 112 on a portion of an upper surface of the body extended from the side lead portion 113. The external power connection leads 21 on the standard BLP 20 are only exposed from a bottom surface of the package body, which will be called "bottom leads".

Figure 7:
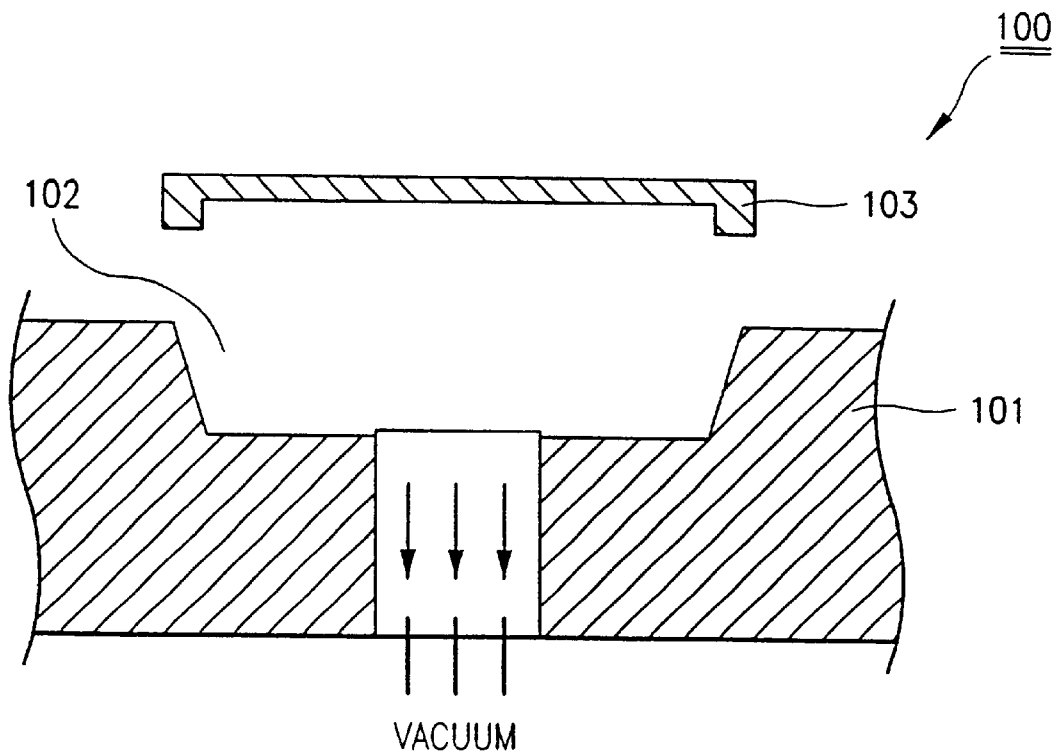
FIG. 7 illustrates a cross section showing key parts of upper, and lower parts of a jig for fabrication of a BLP stack of ultra-high density integrated circuits in accordance with a preferred embodiment of the present invention.
Figure 8:
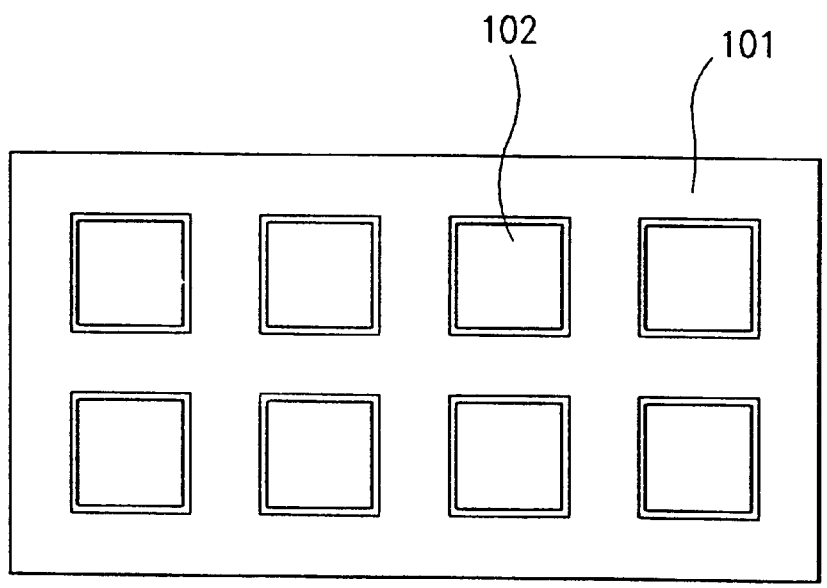
FIG. 8 illustrates an overall plan view of the lower jig in FIG. 7.
Figure 10:
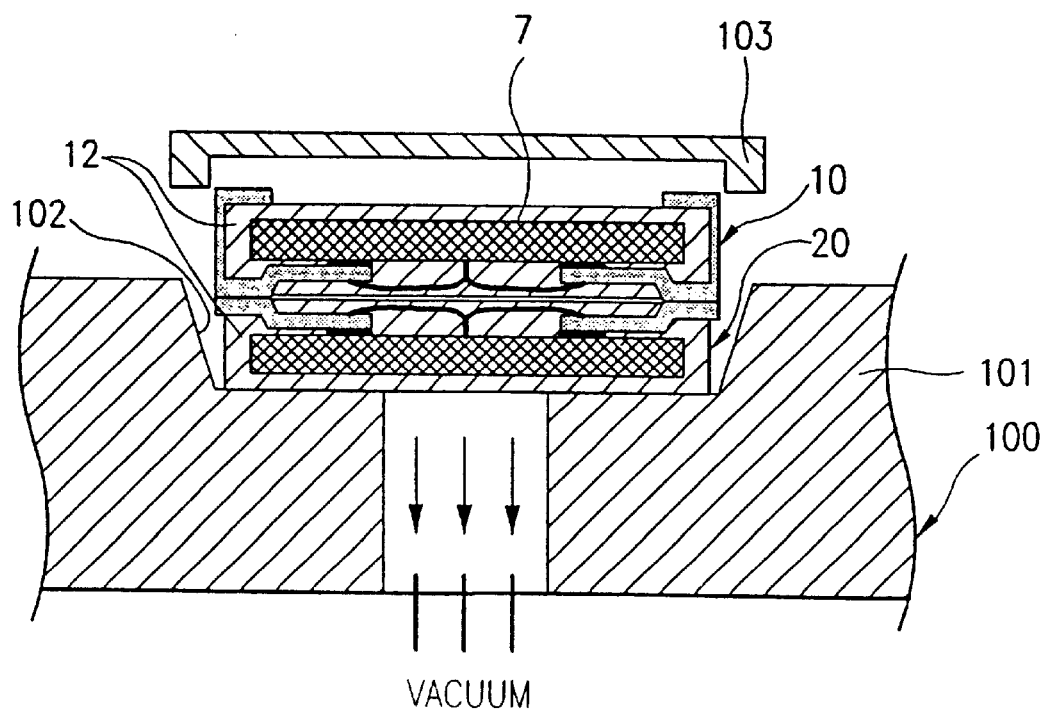
FIG. 10 illustrates a cross section showing a standard type BLP and a three dimensional BLP loaded on the jig in FIG. 7 ready for stacking.

The steps of fabrication process of the foregoing BLP stack in accordance with a first preferred embodiment of the present invention will be explained, with reference to FIGS. 7~10. FIG. 7 illustrates a cross section showing key parts of upper, and lower parts of a jig for fabrication of a BLP stack of ultra-high density integrated circuits in accordance with a preferred embodiment of the present invention, FIG. 8 illustrates an overall plan view of the lower jig in FIG. 7, and FIG. 10 illustrates a cross section showing three dimensional BLPs loaded on the jig 100 in FIG. 7 ready for stacking.

Figure 11:
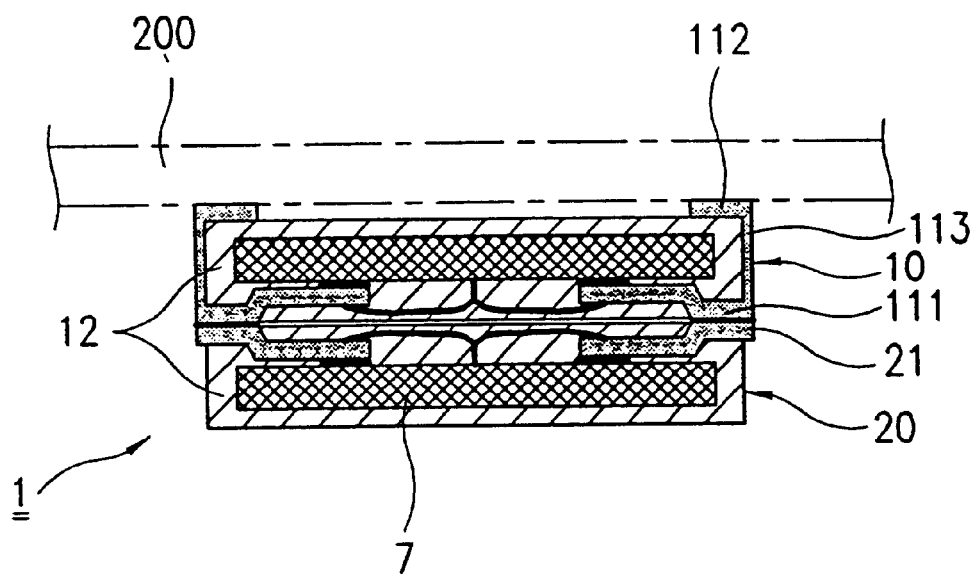
FIG. 11 illustrates a cross section showing a BLP stack of ultra-high density integrated circuits in FIG. 9 mounted on a mother board.

Referring to FIGS. 7~10, the steps of fabrication process of the BLP stack in accordance with a first preferred embodiment of the present invention starts with placing a standard type BLP 20 on a pocket 102 in the stacking lower jig 101 in FIG. 7 with the bottom leads 21 faced upward, and drawing the BLP toward the lower jig with a vacuum to hold the BLP on the lower jig. A three dimensional BLP 10 is then placed on the standard BLP 20, aligning and bringing the bottom leads 21 on the standard BLP 20 and bottom lead portions 111 of the 3D BLP 10 placed on the standard BLP 20 into contact. The 3D BLP 10 is pressed down with the upper jig 103 to hold down the 3D BLP 10 in place, and a laser beam(not shown) is directed to a boundary of the bottom leads 21 of the standard BLP 20 and the bottom lead portions 111 of the 3D BLP 10 in contact with the bottom leads 21, to weld the bottom lead portions 111 of the 3D BLP 10 and the underlying bottom leads 21 of the standard BLP 20. Thus, upon completion of fabrication of the BLP stack of the 3D BLP 10 and the standard BLP 20, as the BLP stack has the semiconductor chips 7 respectively in the 3D BLP 10 and the standard BLP 20 electrically connected, the memory capacity is extended. As shown in FIG. 11, the first embodiment BLP stack 1 of ultra-high density integrated circuits of the present invention can be mounted on a mother board 200. In this instance, the 3D BLP 10 and the standard BLP 20 may be stacked such that the upper lead portions 112 of the 3D BLP 10 and the bottom leads 21 of the standard BLP 20 are welded together. And, the leads 11 on the 3D BLP 10 and the leads 21 on the standard BLP 20 may be bonded together and electrically connected by means of solder or a conductive film.

Figure 12:
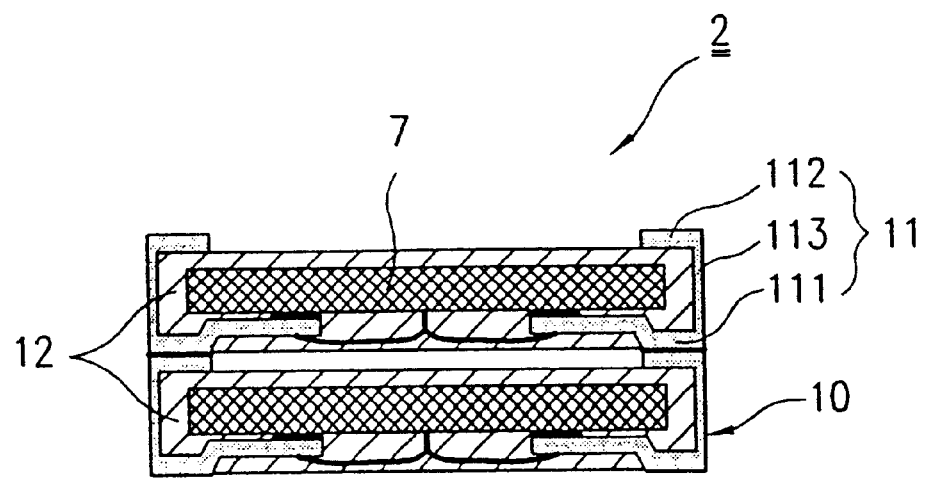
FIG. 12 illustrates a cross section showing a completed three dimensional BLP stack of ultra-high density integrated circuits in accordance with a second preferred embodiment of the present invention(stacking of two three dimensional BLPs)
Figure 13:
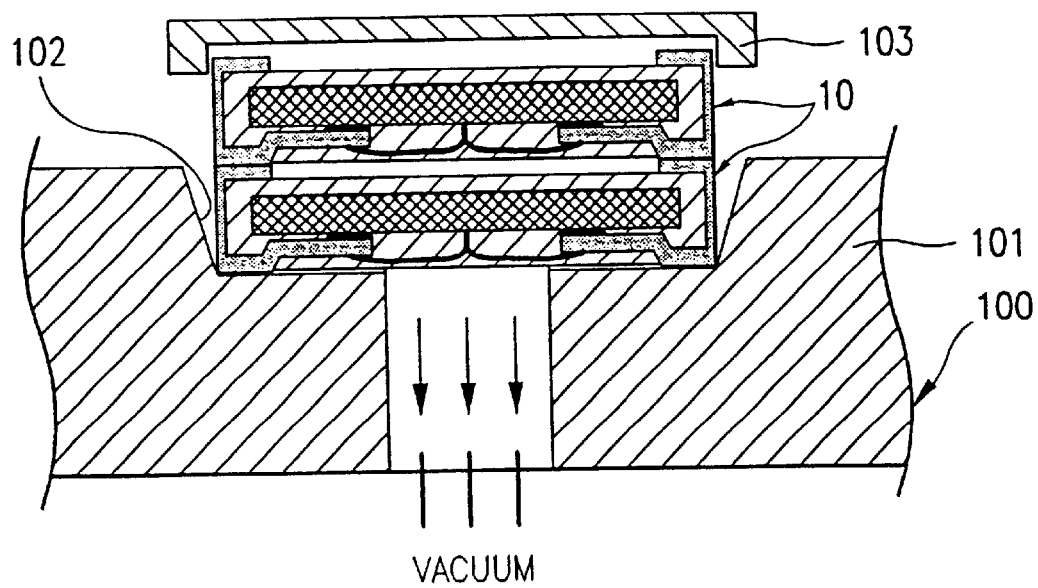
FIG. 13 illustrates a cross section showing three dimensional BLPs loaded on the jig in FIG. 7 ready for stacking.
Figure 14:
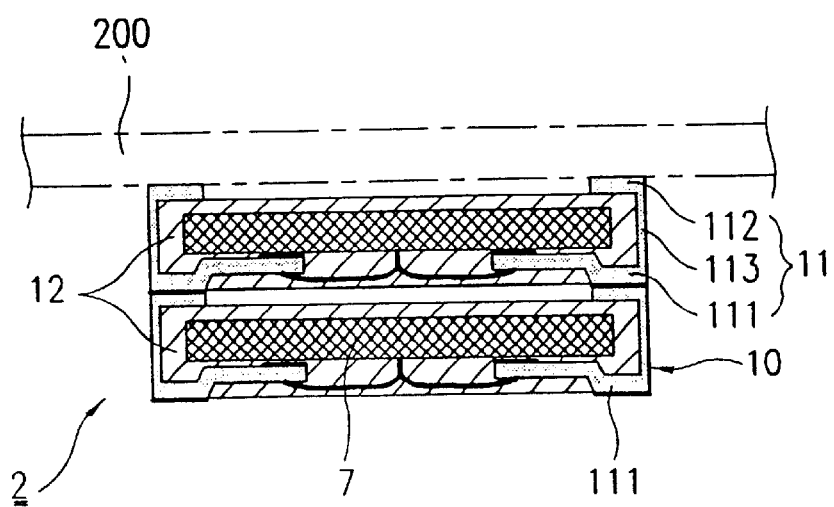
FIG. 14 illustrates a cross section showing a second embodiment BLP stack of ultra-high density integrated circuits mounted on a mother board.

FIG. 12 illustrates a cross section showing a completed three dimensional BLP stack of ultra-high density integrated circuits in accordance with a second preferred embodiment of the present invention(stacking of two three dimensional BLPs), FIG. 13 illustrates a cross section showing three dimensional BLPs loaded on the jig in FIG. 7 ready for stacking, and FIG. 14 illustrates a cross section showing a second embodiment BLP stack of ultra-high density integrated circuits mounted on a mother board.

Referring to FIG. 12, the three dimensional BLP stack 2 of ultra-high density integrated circuits in accordance with a second preferred embodiment of the present invention includes at least two 3D BLPs 10 stacked in succession, each of the 3D BLPs 10 having external power connection leads 11 each started to be exposed through a bottom thereof and extended to bend around to surround a bottom surface, a side surface, and a portion of a top surface thereof, wherein semiconductor chips 7 in the upper and lower 3D BLPs 10 are connected through respective leads 11.

The steps of a fabrication process of the foregoing second embodiment BLP stack of the present invention will be explained.

Referring to FIG. 13, the steps of a fabrication process of the second embodiment BLP stack of the present invention starts with placing a completed 3D BLP 10 in a pocket 102 in the stacking lower jig 101 shown in FIG. 7, and drawing the BLP toward the lower jig with a vacuum to hold the BLP on the lower jig. There is of course a vacuum line(not shown) which can induce a vacuum in the pocket 102 connected to a bottom of the pocket 102. After holding the 3D BLP 10 in place with vacuum, another 3D BLP 10 is placed on the 3D BLP 10. In this instance, the stacked 3D BLPs 10 are aligned such that the upper lead portions 112 exposed in an upper surface of the body of the underlying 3D BLP 10 and the bottom lead portions 111 of the overlying 3D BLP 10 are matched to each other. Then, as shown in FIG. 13, the overlying 3D BLP 10 is pressed down with the upper jig 103 to hold down the 3D BLP 10 in place, and a laser beam(not shown) is directed to a boundary of the leads 11 of the 3D BLPs 10, to weld the leads 11 of the 3D BLPs 10, together. Thus, upon completion of fabrication of the BLP stack of the 3D BLPs 10, as the BLP stack has the semiconductor chips 7 in the 3D BLPs 10 electrically connected, the memory capacity is extended. As shown in FIG. 14, the first embodiment BLP stack of ultra-high density integrated circuits of the present invention thus completed can be mounted on a mother board 200.

Figure 15:
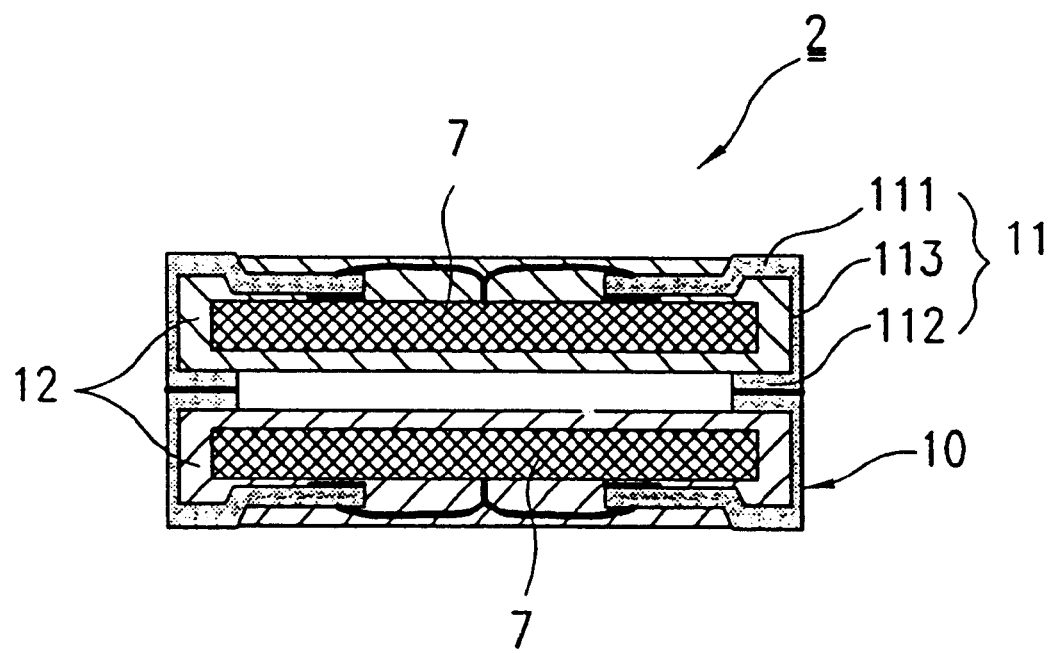
FIG. 15 illustrates a cross section showing a modified version of a second embodiment three dimensional BLP stack of ultra-high density integrated circuits.

FIG. 15 illustrates a cross section showing a modified version of a second embodiment three dimensional BLP stack of ultra-high density integrated circuits, wherein the two 3D BLPs 10 may be stacked different from the foregoing second embodiment such that, in view of the shape of the leads 11, the upper lead portion 112 sides of the leads 11 are faced, and brought into contact with each other, and different from the 3D BLP stack, the two 3D BLPs 10 may be stacked such that the bottom lead portion 111 sides of the leads 11 are faced, and brought into contact with each other.

Figure 16A:
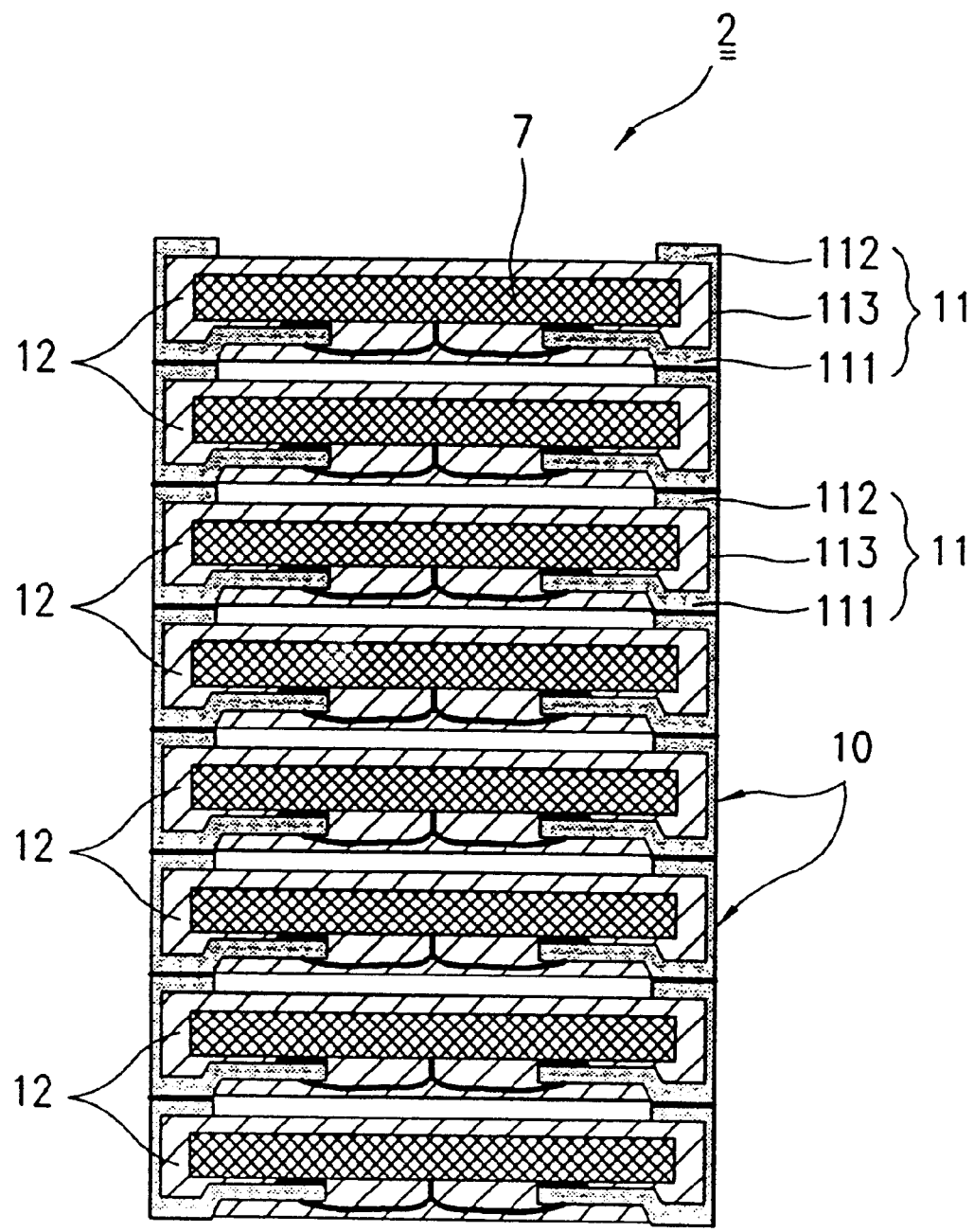
FIG. 16a illustrates a cross section of a second embodiment BLP stack of ultra-high density integrated circuits showing an example of a capacity extension.
Figure 16B:
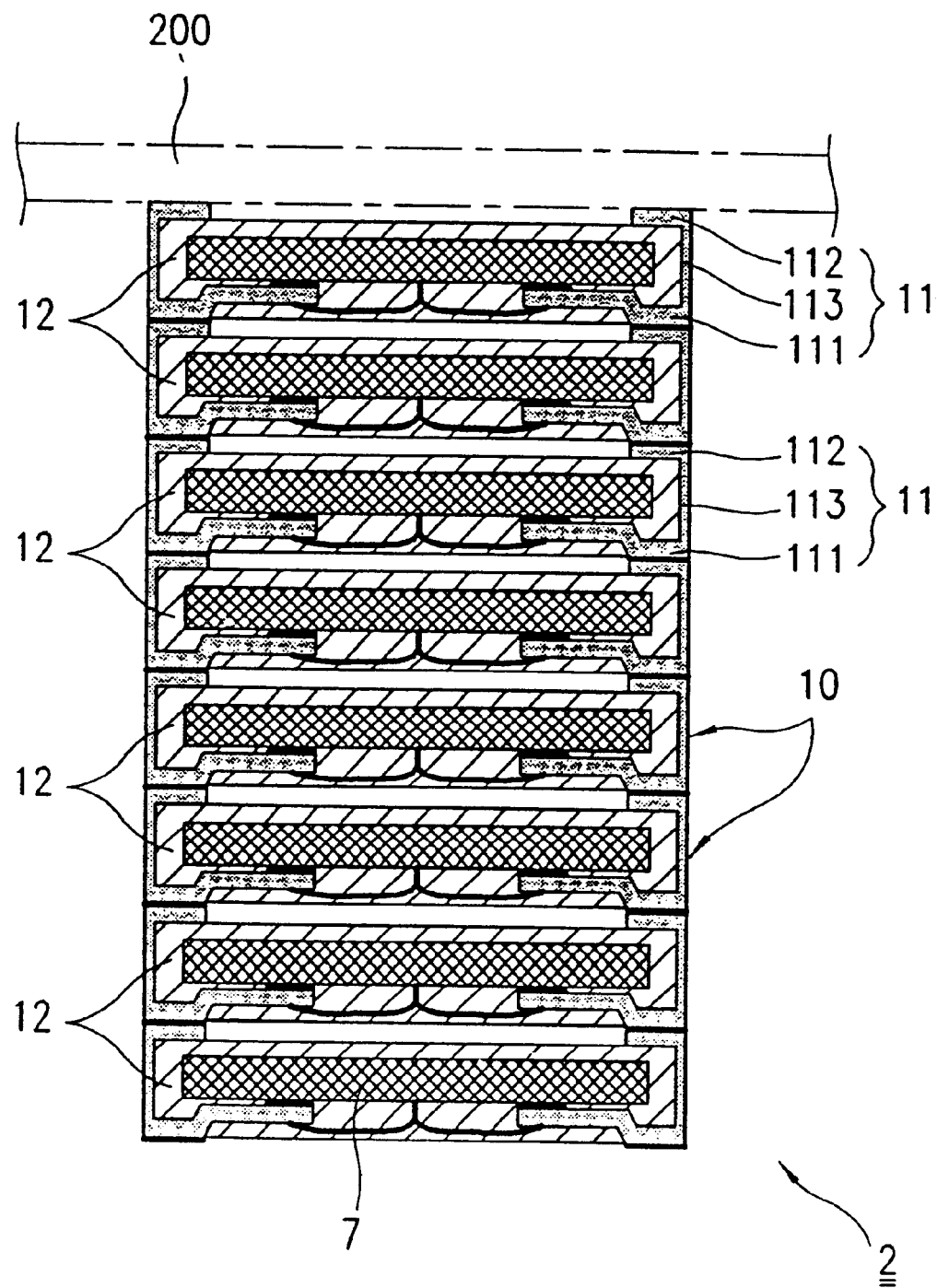
FIG. 16b illustrates a cross section showing the BLP stack of ultra-high density integrated circuits in FIG. 16a mounted on a mother board.
Figure 16C:
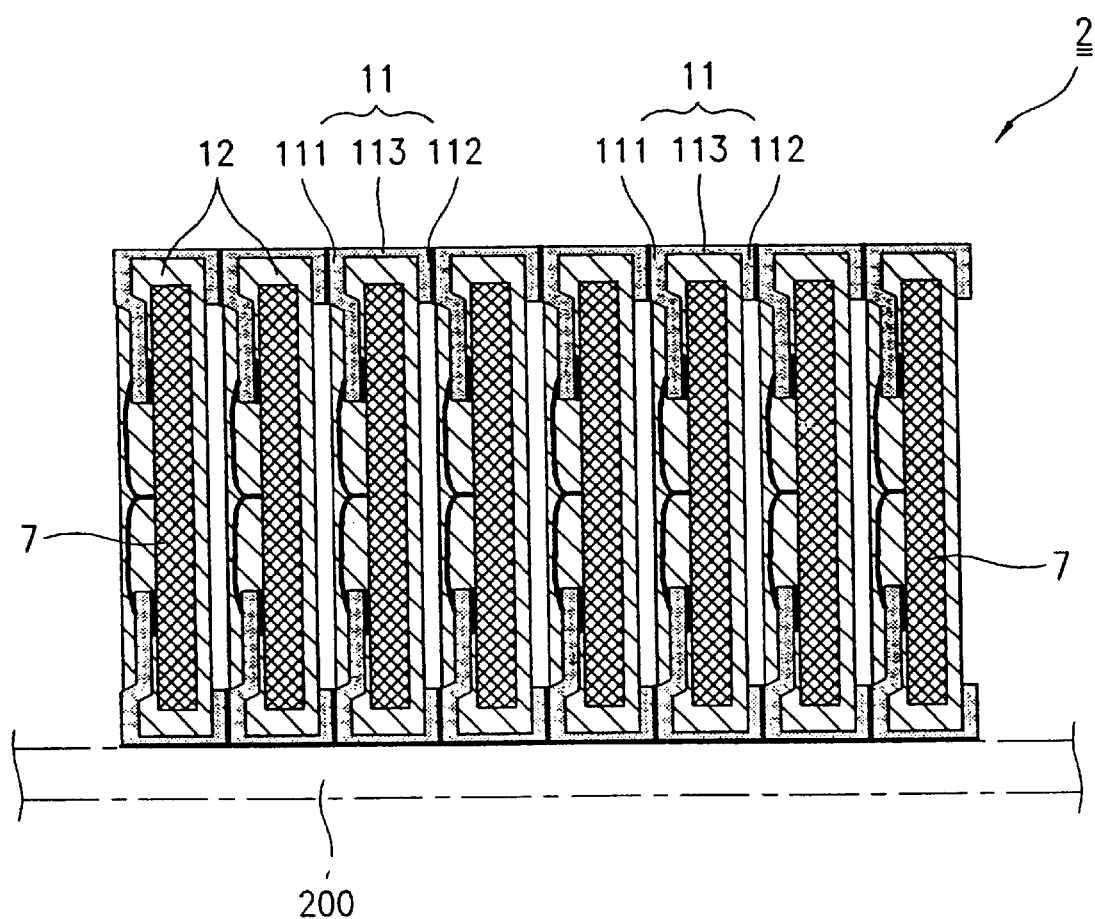
FIG. 16c illustrates a cross section showing the BLP stack of ultra-high density integrated circuits in FIG. 16a mounted on a mother board in another form.

FIG. 16a illustrates a cross section of a second embodiment BLP stack of ultra-high density integrated circuits showing an example of a capacity extension, wherefrom it can be known that the capacity extension is possible just by increasing a number of fitted 3D BLPs 10. The number of stacked 3D BLPs 10 is preferably less than 8, and more preferably, less than 4, for limiting the height from being too high. The BLP stack of ultra-high density integrated circuits in FIG. 16a may be mounted in a form as shown in FIG. 16b, or FIG. 16c.

Figure 17:
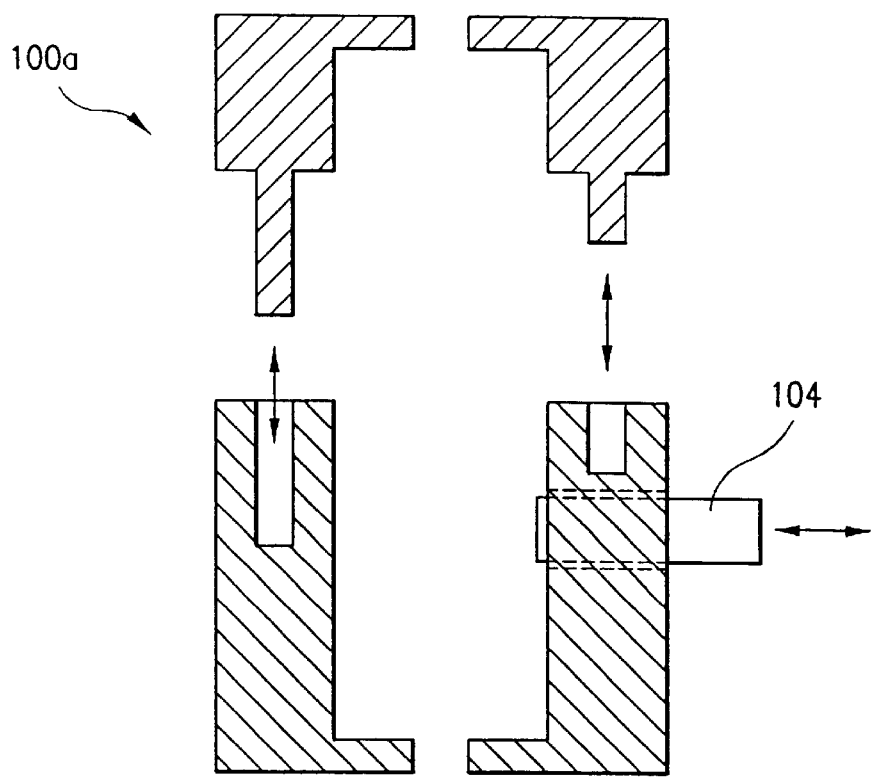
FIG. 17 illustrates a cross section showing another embodiment jig for fabrication of a BLP stack of ultra-high density integrated circuits in accordance with a preferred embodiment of the present invention.
Figure 18:
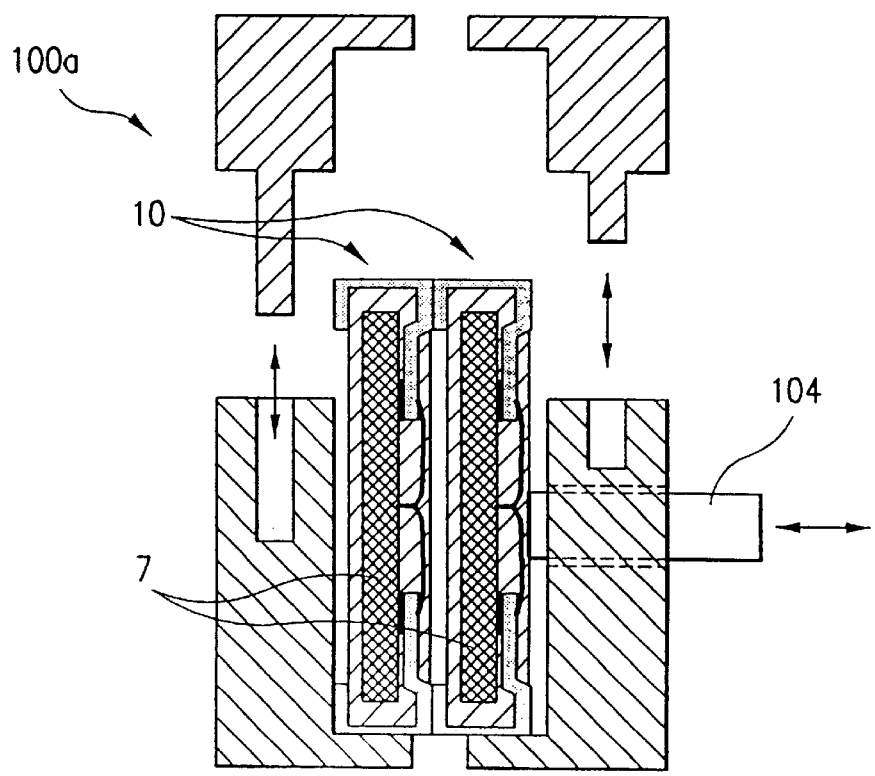
FIG. 18 illustrates a cross section showing three dimensional BLPs loaded on the jig in FIG. 17.

FIG. 17 illustrates a cross section showing another embodiment jig for fabrication of a BLP stack of ultra-high density integrated circuits in accordance with a preferred embodiment of the present invention, and FIG. 18 illustrates a cross section showing three dimensional BLPs 10 loaded on the jig 100a in FIG. 17, wherein a laser beam in a top and down direction is directed to a boundary of the leads 11 of the BLPs stacked and clamped using the jigs 100a fitted in a left and right direction oppositely instead of the upper and lower direction jigs, to weld the leads 11, together. At one side of the jigs 100a fitted oppositely in the left and right direction, there is a guide hole 105 for guiding a pusher 104 when the pusher 104 advances or retracts in pushing either one of the 3D BLPs loaded on the jigs to make a close contact with the other 3D BLP 10.

Figure 19:
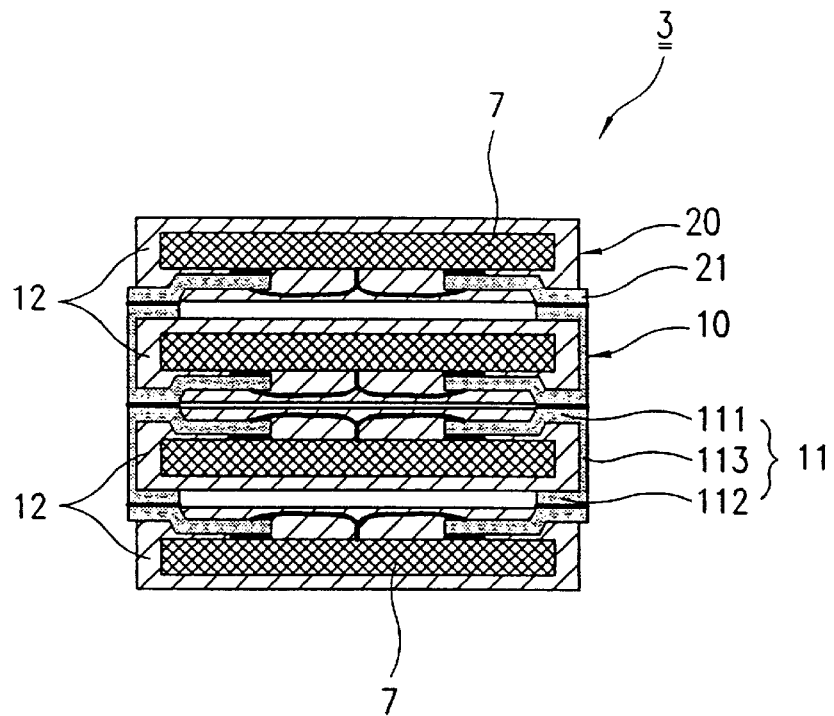
FIG. 19 illustrates a cross section showing a third embodiment BLP stack of ultra-high density integrated circuits of the present invention(stacking of the stack of the standard type BLP and the three dimensional BLP already made)

FIG. 19 illustrates a cross section showing a third embodiment BLP stack of ultra-high density integrated circuits of the present invention(stacking of the stack of the standard type BLP and the three dimensional BLP already made).

Referring to FIG. 19, the third embodiment BLP stack 3 of the present invention includes a first BLP stack and a second BLP stack identical to the first BLP stack disposed opposite to the first BLP such that the bottom leads portions 111 of the 3D BLP 10 in the second BLP stack are brought into contact with the bottom lead portions 111 of the 3D BLP 10 in the first BLP stack, the first BLP stack having a 3D BLP 10 with external power connection leads 11 each started to be exposed through a bottom thereof and extended to bend around to surround a bottom surface, a side surface, and a portion of a top surface thereof, and a standard type BLP 20 stacked on the 3D BLP 10 such that bottom leads 21 of the standard BLP 20 is electrically connected to upper lead portions 111 exposed in an upper surface of a body of the 3D BLP 10.

The steps of a fabricating process of the foregoing third embodiment BLP stack of the present invention will be explained.

Figure 20:
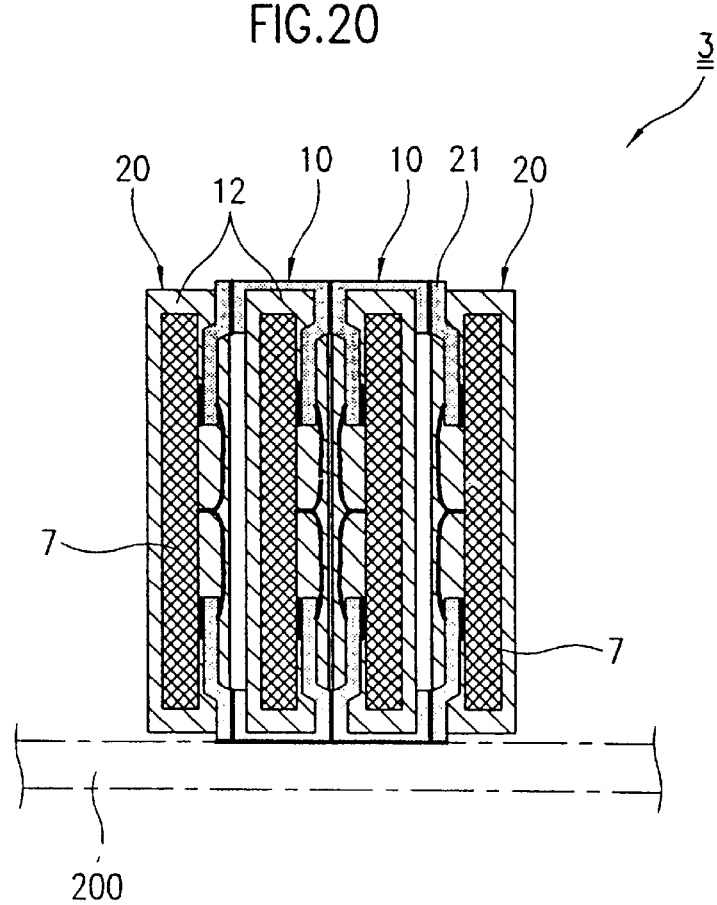
FIG. 20 illustrates a cross section showing a BLP stack of ultra-high density integrated circuits in FIG. 19 mounted on a mother board.

First, the first BLP stack is fabricated including the steps of (1) placing a 3D BLP 10 in a pocket 102 in a stacking lower jig 101, (2) drawing the BLP 10 toward the lower jig with a vacuum to hold the BLP on the lower jig, (3) aligning, and placing the standard type BLP on a top surface of the 3D BLP such that upper lead portions 112 exposed in a top surface of the 3D BLP 10 and the bottom leads 21 on the standard BLP 20 are matched, and (4) directing a laser beam onto fore ends of the bottom leads 21 of the standard type BLP 20 to weld the bottom leads 21 of the standard BLP 20 and bottom lead portions 111 on the 3D BLP 10. Then, a second BLP stack is fabricated through the steps of fabrication process the same with the foregoing steps (1)~(4) and placed on the first BLP stack such that the 3D BLP 10 in the first BLP stack and the 3D BLP 10 in the second BLP stack are brought into contact at respective bottom lead portions 111 facing each other. The first, and second BLP stacks are pressed down by an upper jig 103 holding the stacks in place, and a laser beam is directed onto a boundary of the bottom lead portions 111 of the 3D BLPs 10 in the first, and second BLP stacks, to weld the leads 11 of the 3D BLPs 10 in the first, and second BLP stacks, thereby completing fabrication of the BLP stack 3 in accordance with the third embodiment of the present invention. The BLP stack 3 in accordance with the third embodiment of the present invention may be mounted on a mother board 200 in a form as shown in FIG. 20.

Figure 21:
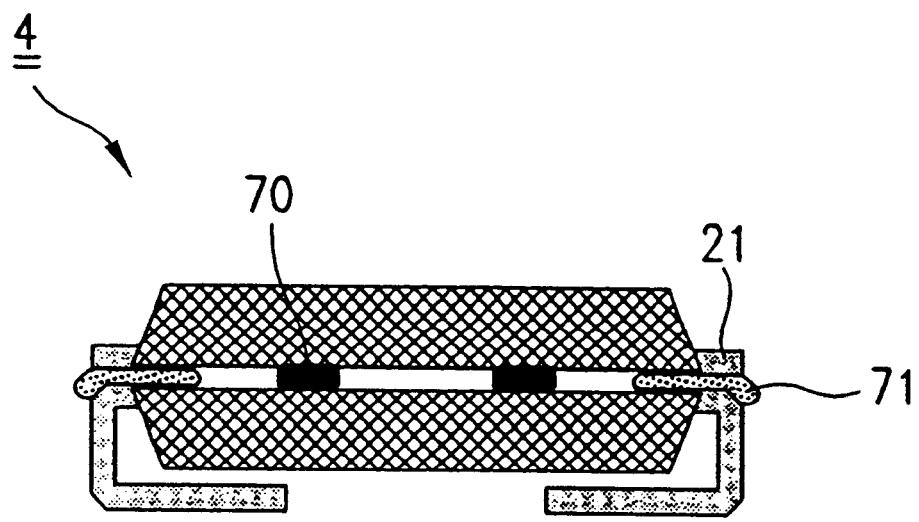
FIG. 21 illustrates a front view showing a fourth embodiment BLP stack of ultra-high density integrated circuits of the present invention(stacking using spacers)
Figure 22:
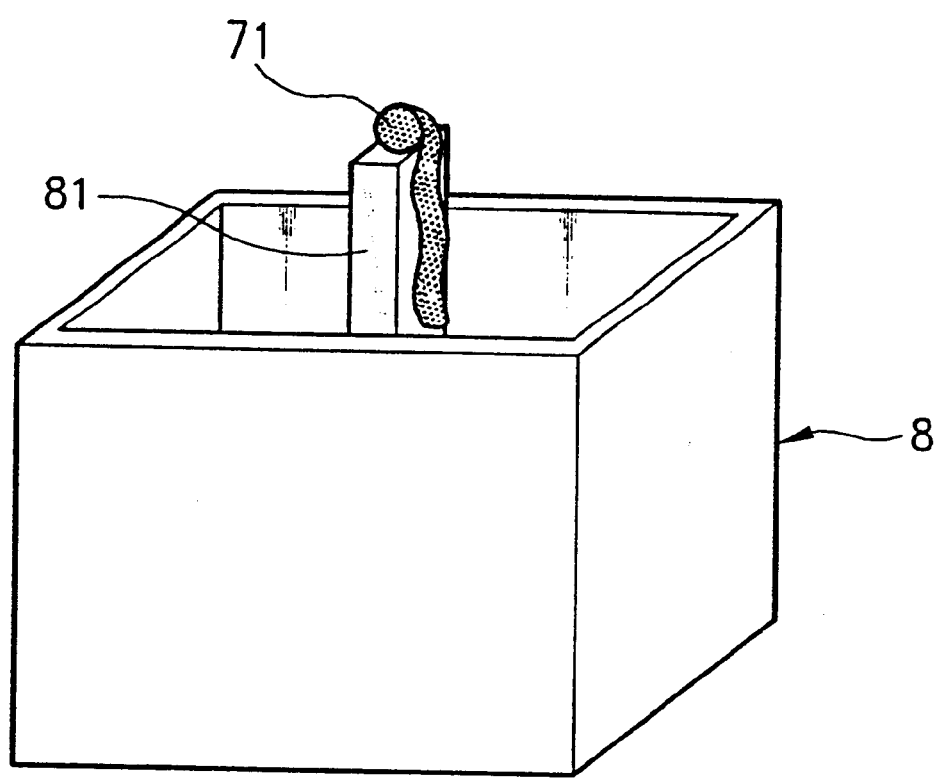
FIG. 22 illustrates a perspective view of a solder dipper applicable to fabrication of the fourth embodiment BLP stack of ultra-high density integrated circuit of the present invention.

FIG. 21 illustrates a front view showing a fourth embodiment BLP stack of the present invention, FIG. 22 illustrates a perspective view of a solder dipper applicable to fabrication of the fourth embodiment BLP stack of the present invention, and FIGS. 23A~23H illustrate front views showing the steps of a fabrication process of the fourth embodiment BLP stack of ultra-high density integrated circuit of the present invention.

Referring to FIG. 21, the fourth embodiment BLP stack 4 of the present invention includes a 3D BLP 10 having external power connection leads 111 each started to be exposed through a bottom thereof and extended to bend around to surround a bottom surface, a side surface, and a portion of a top surface thereof, a standard type BLP 20 placed on the bottom lead portions 111 on the 3D BLP 10 such that the bottom leads 21 are electrically brought into contact with upper lead portions 112 of the 3D BLP 10 exposed in a top surface of the body thereof, and spacers 70 fitted between the 3D BLP 10 and the standard BLP 20 for making the 3D BLP 10 and the standard BLP 20 spaced. The spacer 70 may be adhesive allowing adhesion to either the 3D BLP 10 or the standard BLP 20. The bottom lead portions 111 of the 3D BLP 10 and the bottom leads 21 on the standard BLP 20 are designed to be bonded by dipping into solder 71.

The steps of a fabricating process of the fourth embodiment BLP stack 4 of the present invention will be explained.

Figure 23A:
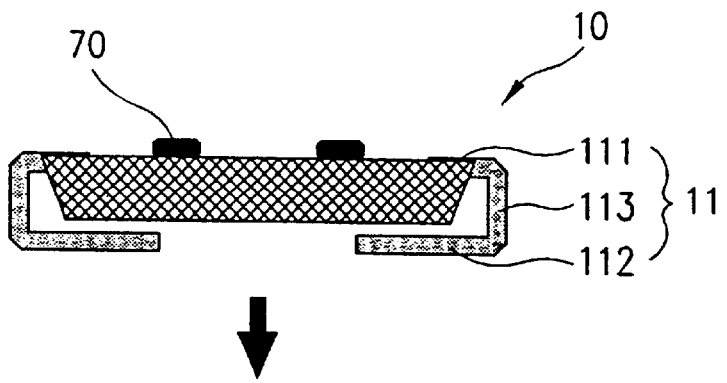
Figure 23B:
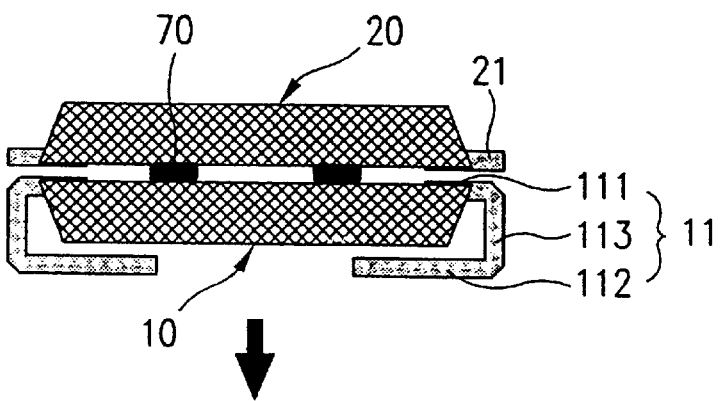
Figure 23C:
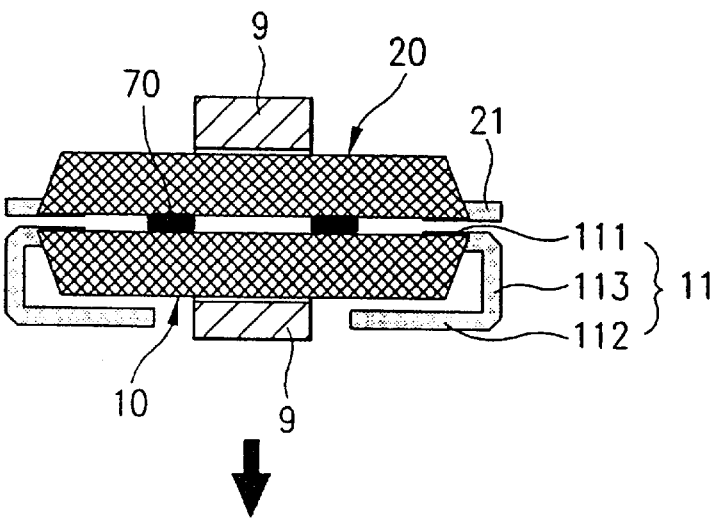
Figure 23D:
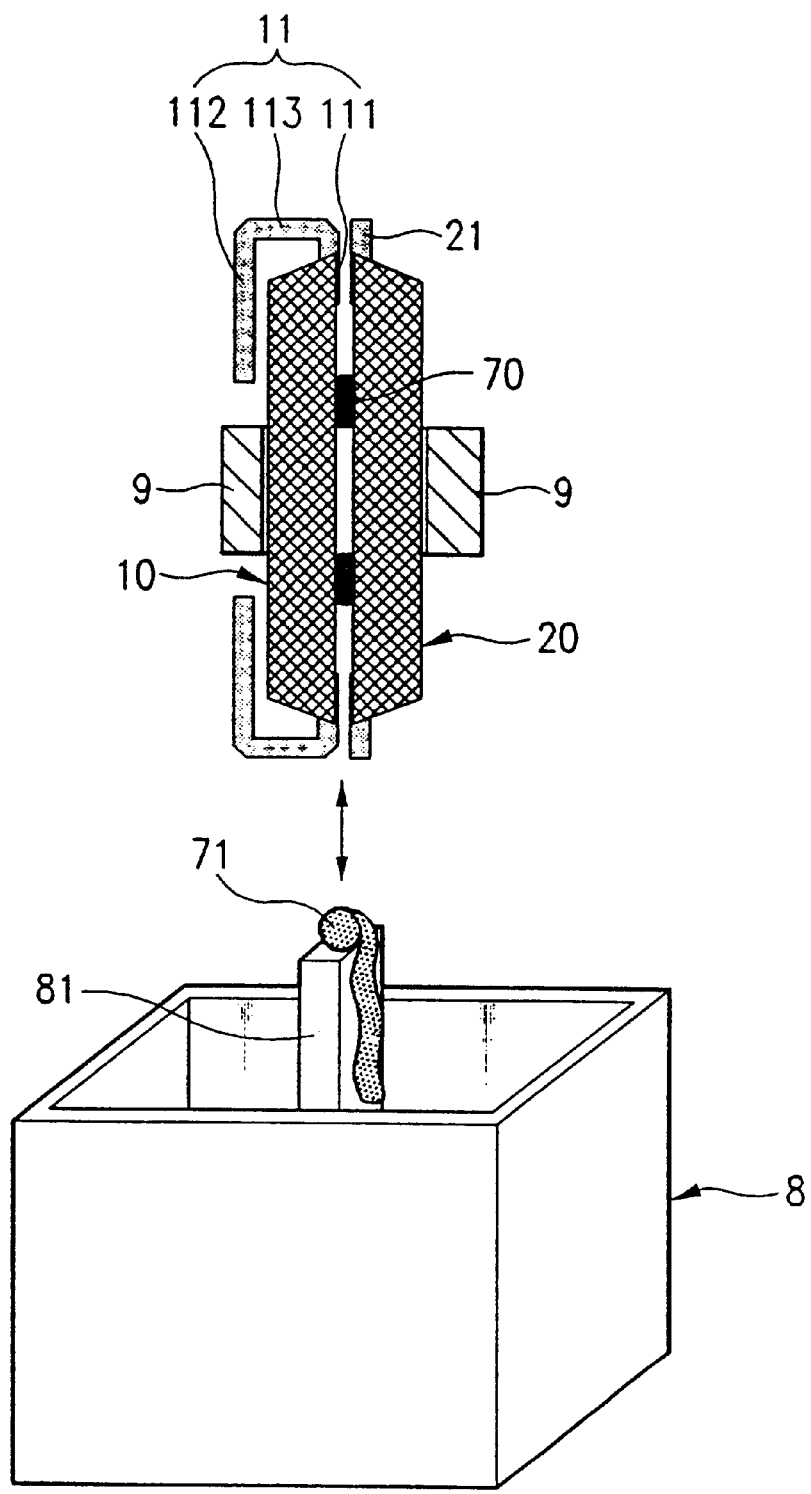
Figure 23E:
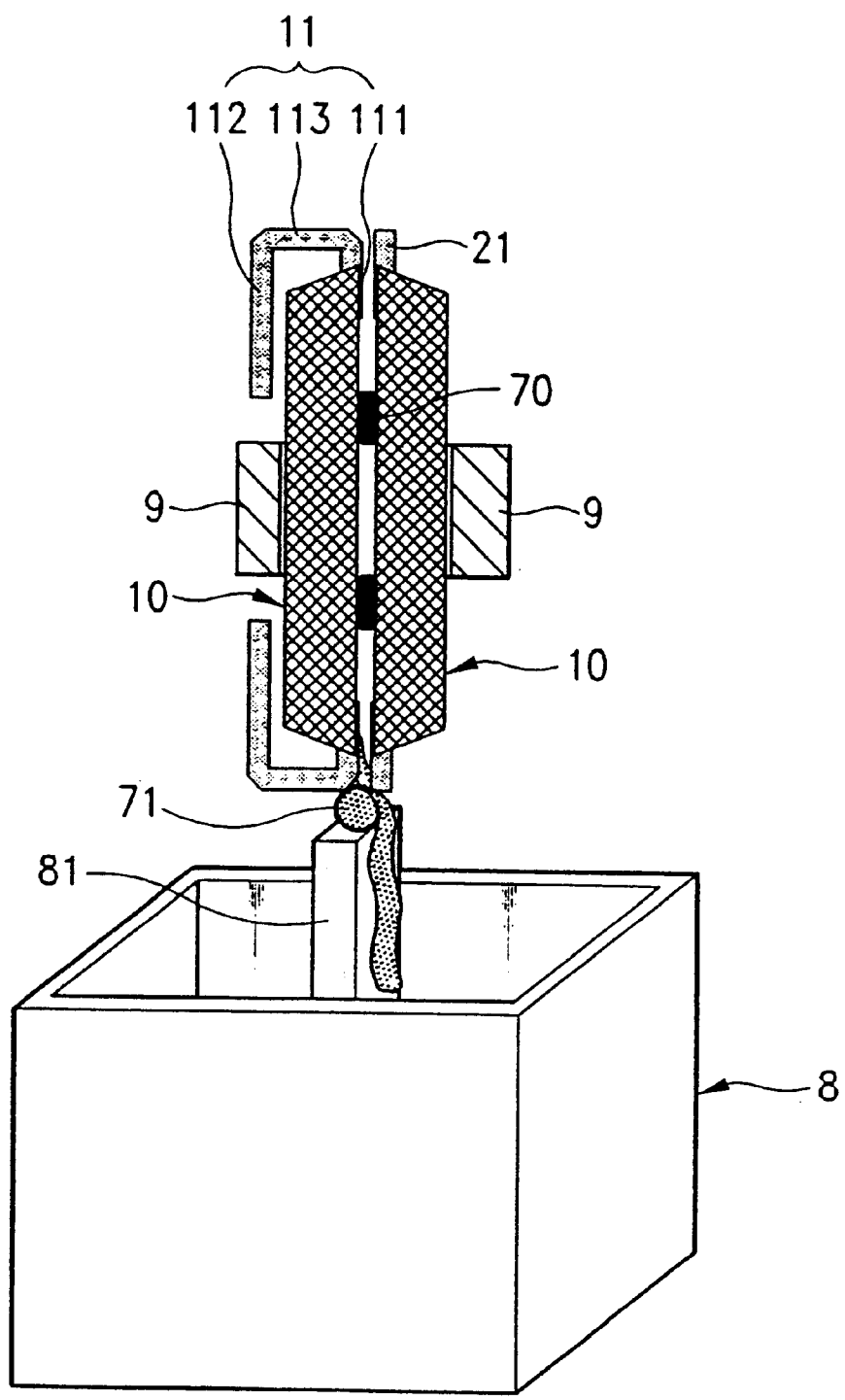
Figure 23F:
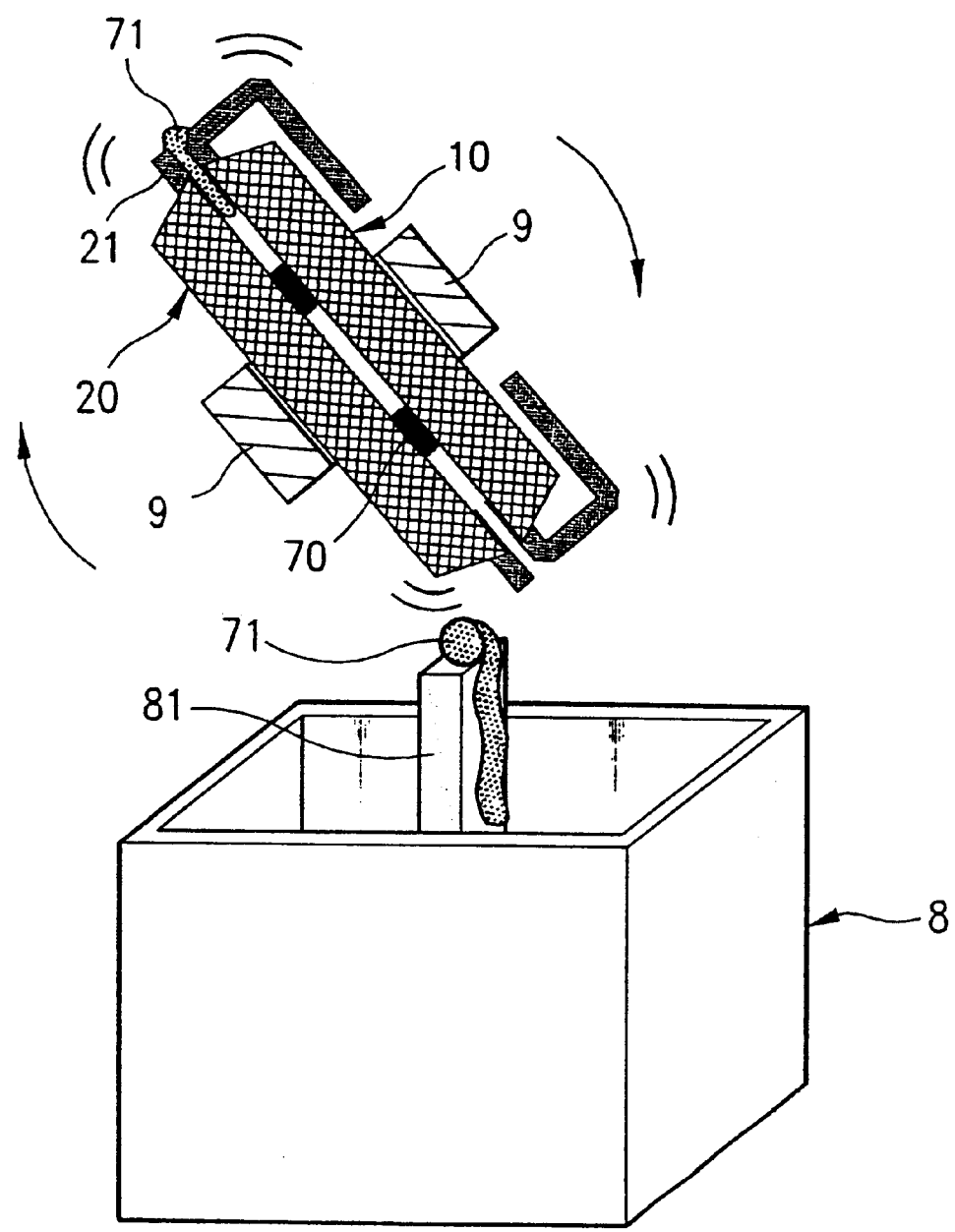
Figure 23G:
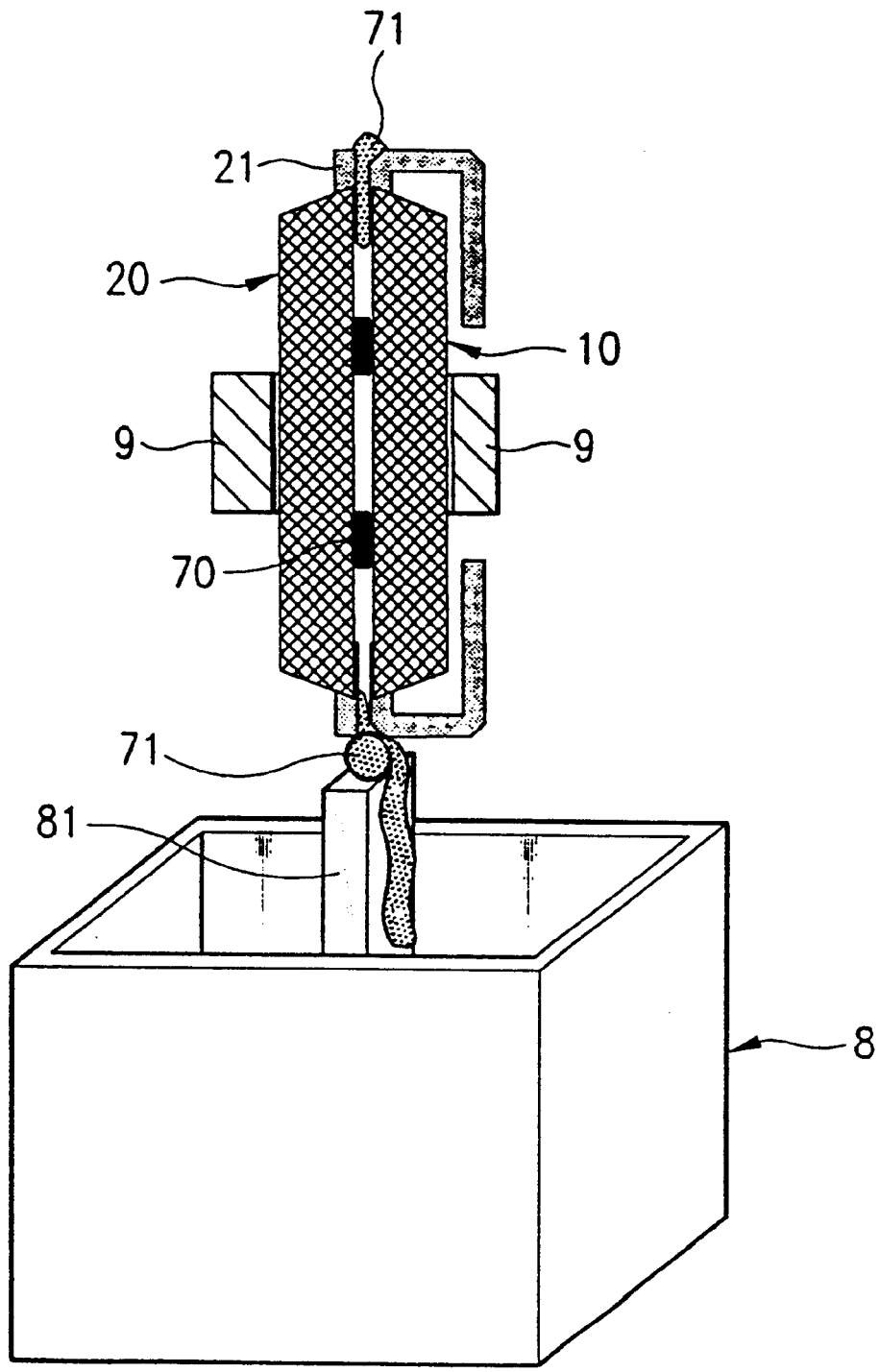
Figure 23H:
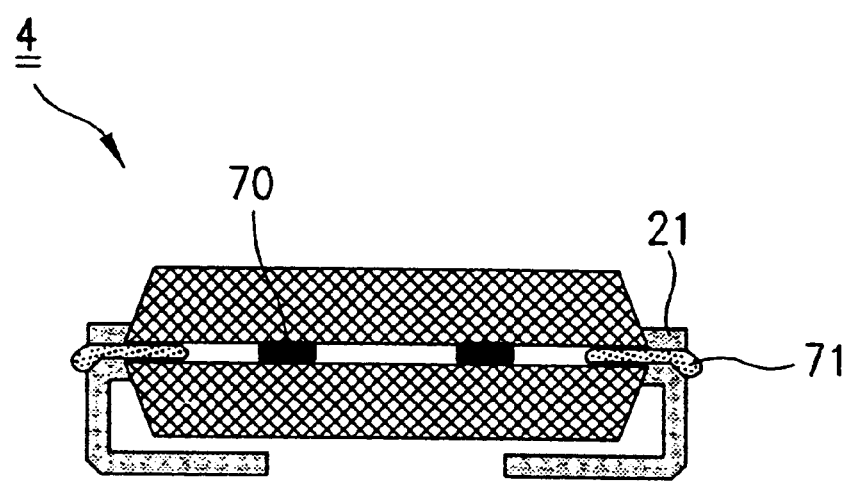
Figure 24:
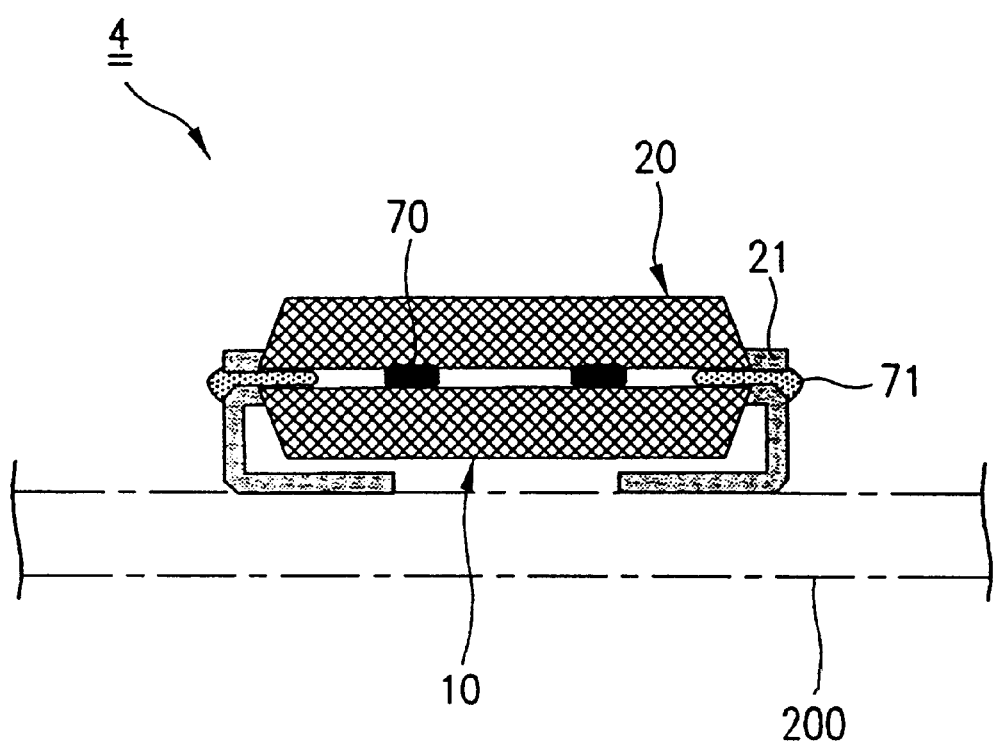

The fabricating process of the fourth embodiment BLP stack 4 of the present invention is started with providing a standard BLP 20 and a 3D BLP 10 as well as a solder dipper 8 as shown in FIG. 22. As shown in FIG. 23A, spacers 70 are dotted on bottom surfaces of a body of the 3D BLP 10 with upper lead portions 112 of the 3D BLP 10 faced down. As shown in FIG. 23B, the standard BLP 20 is mounted on the 3D BLP 10 having the spacers 70 dotted thereon. As shown in FIG. 23C, the standard BLP 20 and the 3D BLP 10 are clamped with a holding jig 9 at a time. The clamped standard BLP 20 and the 3D BLP 10 are brought over the solder dipper 8 by means of the holding jig 9 such that fore ends both of the bottom lead portions 111 at one side of the 3D BLP 10 and the bottom leads 21 at one side of the standard BLP 20 are dipped in the solder 71 discharged through a solder feeding tip 81 in the solder dipper 8 as shown in FIGS. 23d and 23d, to solder, and electrically connect the bottom lead portions 111 at one side of the 3D BLP 10 and the opposite bottom leads 21 at one side of the standard BLP 20. A gap between the standard BLP 20 and the 3D BLP 10 provided by the spacers 70 allows an easy flow of solder into the gap, which improves a bond reliability between packages. Surplus of the solder 71 spouted through the solder feeding tip 81 on the center of the solder dipper 8 after use in the soldering is returned to a storage again for recirculation. Upon completion of solder dipping on the leads 11 at one side of the package stack, the holding jig 9 is turned while vibrating as shown in FIG. 23F in a movement to bring opposite leads to the dipping position, for keeping an amount of solder adhered to the leads 11 of the package stack constant and enhancing a wide spread of solder in the gap between the packages, for which a vibrating device inclusive of a vibrating motor(not shown) is provided. When the holding jig 9 completes vibration and a 180° rotation, fore ends both of the bottom lead portions 111 at the other side of the 3D BLP 10 and the bottom leads 21 at the other side of the standard BLP 20 are dipped in the solder 71 discharged through a solder feeding tip 81 in the solder dipper 8 as shown in FIGS. 23g, to solder, and electrically connect the bottom lead portions 111 at the other side of the 3D BLP 10 and the opposite bottom leads 21 at the other side of the standard BLP 20. The 3D BLP stack 4 of ultra-high density integrated circuits completed thus (shown in FIG. 23H) has a memory capacity extended and can be mounded on a mother board 200 in a form as shown in FIG. 24.

The BLP stack of the present invention as has been explained can provide a high density BLP stack, with the shortest signal paths, that allows to provide a fast BLP stack. The BLP stack of the present invention has simple, fast, and reliable fabrication process. Accordingly, the package stack can be fabricated at a low cost, in a short time period with a reduced TAT, and with an improved productivity.

It will be apparent to those skilled in the art that various modifications and variations can be made in the BLP stack of ultra-high density integrated circuits and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a BLP stack of ultra-high density integrated circuits, comprising the steps of:
   (1) placing a second package having external power connection leads started to be exposed through a bottom surface of a body in a pocket in a stacking lower jig such that the leads face upward;
   (2) vacuum drawing the second package placed in the pocket in the stacking lower jig;
   (3) placing a first package on a top surface of the second package such that external power connection leads on the first package and bottom lead portions of the second package are brought into contact, the external power connection leads having bottom lead portions started to be exposed through a bottom surface of a body, side lead portions on a side surface of the body extended from the bottom lead portions, and upper lead portions on the top surface of the body extended from the side lead portions;
   (4) pressing down the first package with an upper jig to clamp the first package and the second package; and,
   (5) directing a laser beam onto a boundary of the bottom lead portions of the first package and the external power connection leads on the second package in contact with the bottom lead portions of the first package for welding the external power connection leads on the second package and the leads of the first package.

2. A method as claimed in claim 1, wherein placing the first package in the pocket in the stacking lower jig instead of the second package, and placing another first package on a top of the first package such that the external power connection leads of the two first packages are brought into contact, for stacking the two first packages.

3. A method as claimed in claim 1, further comprising the steps of:
   dotting spacers on a bottom surface of the first package with the bottom lead portions of the first package faced upward,
   mounting the second package on the first package having the spacers dotted thereon,
   clamping the first, and second packages with a holding jig,
   bringing the clamped the first, and second packages over a solder dipper by moving the holding jig such that fore ends both of the bottom lead portions at one side of the first package and the external power connection leads at one side of the second package are dipped in the solder discharged through a solder feeding tip in the solder dipper, to solder, and electrically connect the bottom lead portions at one side of the first package and the opposite external power connection leads at one side of the second package, and
   turning the holding jig while being vibrated in a movement to bring fore ends both of the bottom lead portions at the other side of the clamped first package and the external power connection leads at the other side of the second package into dipping in the solder discharged through the solder feeding tip in the solder dipper, to solder, and electrically connect the bottom lead portions at the other side of the first package and the opposite external power connection leads at the other side of the second package.

* * * * *